(12) United States Patent
Fujita et al.

(10) Patent No.: US 10,908,223 B2
(45) Date of Patent: Feb. 2, 2021

(54) BATTERY SAFETY EVALUATION APPARATUS, BATTERY SAFETY EVALUATION METHOD, NON-TRANSITORY STORAGE MEDIUM, CONTROL CIRCUIT, AND POWER STORAGE SYSTEM

(71) Applicant: KABUSHIKI KAISHA TOSHIBA, Minato-ku (JP)

(72) Inventors: Yumi Fujita, Chuo (JP); Tomokazu Morita, Funabashi (JP); Nobukatsu Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 350 days.

(21) Appl. No.: 16/127,815

(22) Filed: Sep. 11, 2018

(65) Prior Publication Data

US 2019/0293720 A1 Sep. 26, 2019

(30) Foreign Application Priority Data

Mar. 20, 2018 (JP) ................................ 2018-053299

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *H01M 10/425* (2013.01);
(Continued)

(58) Field of Classification Search
CPC ............ H01M 10/425; H01M 10/4285; G01R 31/367
See application file for complete search history.

(56) References Cited

U.S. PATENT DOCUMENTS

2001/0022518 A1* 9/2001 Asakura ............... G01R 31/392
324/426
2005/0248311 A1 11/2005 Komaki et al.
(Continued)

FOREIGN PATENT DOCUMENTS

EP 2 012 135 A1 1/2009
JP 4-186179 7/1992
(Continued)

*Primary Examiner* — Alvaro E Fortich
(74) *Attorney, Agent, or Firm* — Oblon, McClelland, Maier & Neustadt, L.L.P.

(57) ABSTRACT

An apparatus which is an embodiment of the present invention includes a first estimator, a second estimator and a calculator, and evaluates the present safety of a battery. The first estimator estimates a present deterioration state and a present SOC of the battery. The second estimator estimates, on the basis of first reference data, a calorific value of the battery in an occasion when an external temperature changes. The first reference data is selected as corresponding to the first battery from a plurality of reference data at least indicating relationship between a calorific value of a secondary battery and an external temperature on the basis of the estimated deterioration state and SOC. The calculator calculates, on the basis of the calorific value of the battery, a safety index regarding a temperature of the battery in the occasion when the external temperature changes.

17 Claims, 16 Drawing Sheets

(51) Int. Cl.
  *H01M 10/42* (2006.01)
  *H01M 10/48* (2006.01)
  *G01R 31/374* (2019.01)
  *H02J 7/00* (2006.01)

(52) U.S. Cl.
  CPC ....... *H01M 10/4285* (2013.01); *H01M 10/48* (2013.01); *G01R 31/374* (2019.01); *H01M 10/486* (2013.01); *H01M 10/488* (2013.01); *H02J 7/0029* (2013.01)

(56) References Cited

U.S. PATENT DOCUMENTS

| | | | |
|---|---|---|---|
| 2008/0284378 A1 | 11/2008 | Birke et al. | |
| 2013/0119939 A1* | 5/2013 | Yonezawa | H02J 7/0091 320/134 |
| 2013/0141109 A1 | 6/2013 | Love et al. | |
| 2013/0158917 A1 | 6/2013 | Uchida | |
| 2015/0165921 A1 | 6/2015 | Paryani | |
| 2015/0323611 A1* | 11/2015 | Kise | H01M 10/42 702/63 |
| 2016/0077159 A1 | 3/2016 | Petrucelli | |
| 2016/0181833 A1 | 6/2016 | Araki et al. | |
| 2016/0195589 A1 | 7/2016 | Hanyu et al. | |
| 2017/0104347 A1 | 4/2017 | Shimonishi et al. | |
| 2017/0263984 A1 | 9/2017 | Fujita et al. | |
| 2018/0006335 A1 | 1/2018 | Fujita et al. | |
| 2018/0267108 A1 | 9/2018 | Morita et al. | |

FOREIGN PATENT DOCUMENTS

| | | |
|---|---|---|
| JP | 2005-321983 | 11/2005 |
| JP | 2008-67523 | 3/2008 |
| JP | 2009-514504 | 4/2009 |
| JP | 2011-75558 | 4/2011 |
| JP | 2013-81332 | 5/2013 |
| JP | 2013-89423 | 5/2013 |
| JP | 2015-60761 | 3/2015 |
| JP | 2015-111071 | 6/2015 |
| JP | 2017-73331 | 4/2017 |
| JP | 2017-166874 | 9/2017 |
| JP | 2018-156739 A | 10/2018 |
| WO | WO 2012/060190 A1 | 5/2012 |
| WO | WO 2014/103705 A1 | 7/2014 |
| WO | WO 2015/025402 A1 | 2/2015 |
| WO | WO 2017/046870 A1 | 3/2017 |
| WO | WO 2018/025965 A1 | 2/2018 |
| WO | WO 2019/058583 A1 | 3/2019 |

* cited by examiner

BATTERY SAFETY EVALUATION APPARATUS, BATTERY SAFETY EVALUATION METHOD, NON-TRANSITORY STORAGE MEDIUM, CONTROL CIRCUIT, AND POWER STORAGE SYSTEM

CROSS-REFERENCE TO RELATED APPLICATION (S)

This application is based upon and claims the benefit of priority from Japanese Patent Application No. 2018-053299, filed Mar. 20, 2018; the entire contents of which are incorporated herein by reference.

FIELD

Embodiments described herein relate generally to a battery safety evaluation apparatus, a battery safety evaluation method, a non-transitory storage medium, a control circuit, and a power storage system.

BACKGROUND

Nonaqueous electrolyte secondary batteries such as lithium ion batteries are known to have risks to cause situations such as fuming, firing and the like. There have been reported situations that a lithium ion battery fires in an aircraft. Therefore, restrictions are applied to such nonaqueous electrolyte secondary batteries, for example, they are restricted from being carried in an aircraft. However, since many nonaqueous electrolyte secondary batteries are used for laptop PCs, smart phones and the like, it is difficult for use of nonaqueous electrolyte secondary batteries to be completely restricted. Moreover, such restrictions on their carrying-in impair users' convenience.

If safety of a nonaqueous electrolyte secondary battery can be examined in real time, the secondary battery that is determined to be safe can be relieved of the restriction. However, it has been difficult to recognize the present state of a nonaqueous electrolyte secondary battery, and effective methods have not yet been established.

DETAILED DESCRIPTION

An embodiment of the present invention shows the present safety of a secondary battery, and thereby, enables secondary batteries to be individually handled in accordance with the present safety of each of those.

A battery safety evaluation apparatus which is an embodiment of the present invention includes a battery state estimator, a calorific value estimator and a safety index calculator, and evaluates the present safety of a first battery. The battery state estimator estimates a present deterioration state of the first battery and a present SOC of the first battery. The calorific value estimator estimates, on the basis of first reference data, a calorific value of the first battery in an occasion when an external temperature changes. The first reference data is selected as corresponding to the first battery from a plurality of reference data at least indicating relationship between a calorific value of a secondary battery and an external temperature on the basis of the present deterioration state of the first battery and the present SOC of the first battery. The safety index calculator calculates, on the basis of the calorific value of the first battery, a safety index regarding a temperature of the first battery in the occasion when the external temperature changes.

Below, a description is given of embodiments of the present invention with reference to the drawings. The present invention is not limited to the embodiments.

First Embodiment

Figure 1:
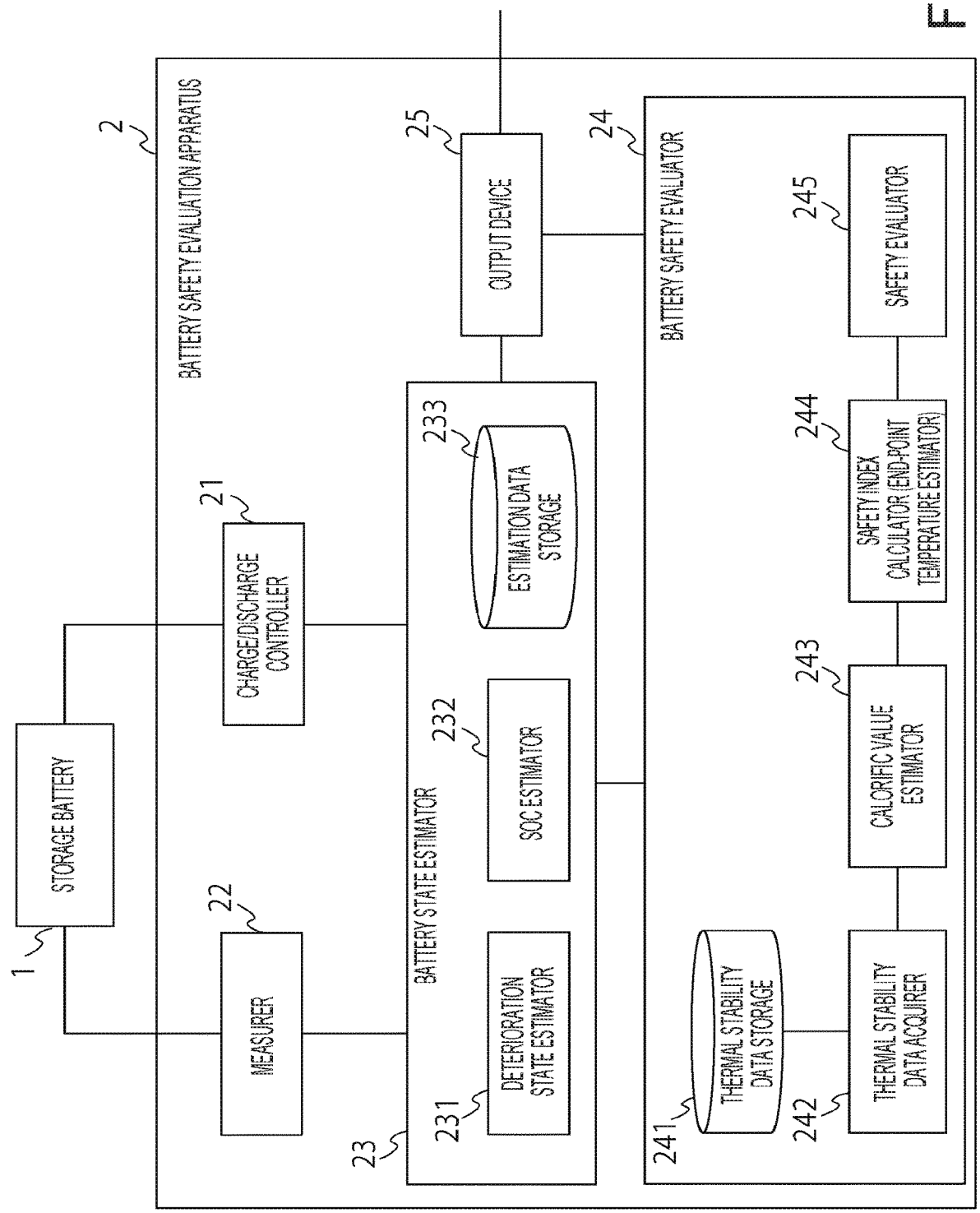
FIG. 1 is a block diagram illustrating an example of a schematic configuration of a power storage system including a battery safety evaluation apparatus according to a first embodiment.

FIG. 1 is a block diagram illustrating an example of a schematic configuration of a power storage system including a battery safety evaluation apparatus according to a first embodiment. The power storage system includes a storage battery 1 and a battery safety evaluation apparatus 2. The battery safety evaluation apparatus 2 includes a charge/discharge controller 21, a measurer 22, a battery state estimator 23, a battery safety evaluator 24 and an output device 25. The battery state estimator 23 includes a deterioration state estimator 231, an SOC estimator 232, and an estimation data storage 233. The battery safety evaluator 24 includes a thermal stability data storage 241, a thermal stability data acquirer (reference data acquirer) 242, a calorific value estimator 243, a safety index calculator (endpoint cell temperature estimator) 244 and safety evaluator 245.

Incidentally, the battery safety evaluation apparatus 2 realized by a CPU, a control circuit or the like may be provided to the storage battery 1 such that the battery safety evaluation apparatus 2 is realized so as to be integrated with the storage battery 1. Alternatively, by installing a program in a device which uses the storage battery 1, the device may be realized as the battery safety evaluation apparatus 2.

The storage battery 1 (first battery) is a secondary battery to be evaluated in its safety by the battery safety evaluation apparatus 2. The evaluation of safety indicates whether the storage battery 1 is safe even when the storage battery 1 is exposed to high temperature. As the storage battery 1, there are supposed a nonaqueous electrolyte secondary battery such as a lithium ion secondary battery, an assembled battery with such nonaqueous electrolyte secondary batteries, and the like. Nevertheless, the storage battery 1 is not limited to these but the storage battery 1 is sufficient to be a rechargeable secondary battery.

Incidentally, charge/discharge may mean any one of charge and discharge or may mean both of these. Moreover, in the description below, unless alternatively mentioned, the term "storage battery" includes an assembled battery, a battery module and a unit cell.

The storage battery 1 may be a storage battery installed in devices such, for example, as cellular phones, laptop computers, electric bicycles, electric vehicles, hybrid vehicles using both electricity and gasoline, and drones. Further, the storage battery 1 may be a stationary storage battery installed for each structure such as a private house, a building and a factory. The storage battery 1 may be a storage battery linked with or interconnected with a power generation system.

The battery safety evaluation apparatus 2 evaluates present safety of the storage battery 1. First, the battery safety evaluation apparatus 2 estimates a present state of the storage battery 1. Next, it estimates an internal temperature and the like of the storage battery 1, assuming that the storage battery 1 is exposed to high temperature in the estimated present state. Then, it calculates an index indicating safety of the storage battery 1 on the basis of the estimated internal temperature and the like of the storage battery 1. Thereby, the index or evaluation based on the index is to indicate the present safety of the storage battery 1.

Incidentally, the "present" is defined as a most recent time point when the measurer 22 has generated measurement data needed for evaluating the safety.

Incidentally, cases of being exposed to high temperature not only include cases of suffering heat from the outside but also include cases where an electronic circuit, another unit cell in the assembled battery, or the like causes abnormal heat generation, firing or the like.

The "present state" of the storage battery 1 estimated by the battery safety evaluation apparatus 2 means a present deterioration state and a present SOC (state of charge). It is known that a secondary battery more tends to cause abnormal heat generation as it deteriorates more. Therefore, it is needed to estimate a deterioration state of the storage battery 1. The storage battery 1 deteriorates in accordance with the operating time of the storage battery 1. Hence, deterioration of the storage battery 1 can be recognized by investigating a parameter regarding the storage battery 1 which increases or decreases in accordance with the operating time of the storage battery 1. For example, the initial charge amount of a positive electrode or a negative electrode, the capacity (mass) of the positive electrode or the negative electrode, a battery capacity, an open circuit voltage, and the like correspond to such parameters indicating the deterioration state since they increase or decrease as the storage battery 1 is being used. As above, there are several parameters indicating the deterioration state. It may be predefined which parameter is to be used as the deterioration state, and they may be freely sorted and picked out.

Moreover, in general, at the same deterioration state, a higher SOC of the storage battery 1 leads to a higher degree of firing risk. That is, when there are two storage batteries 1 having the same deterioration state, the storage battery 1 having a higher present SOC leads to a higher degree of firing risk.

Figure 2:
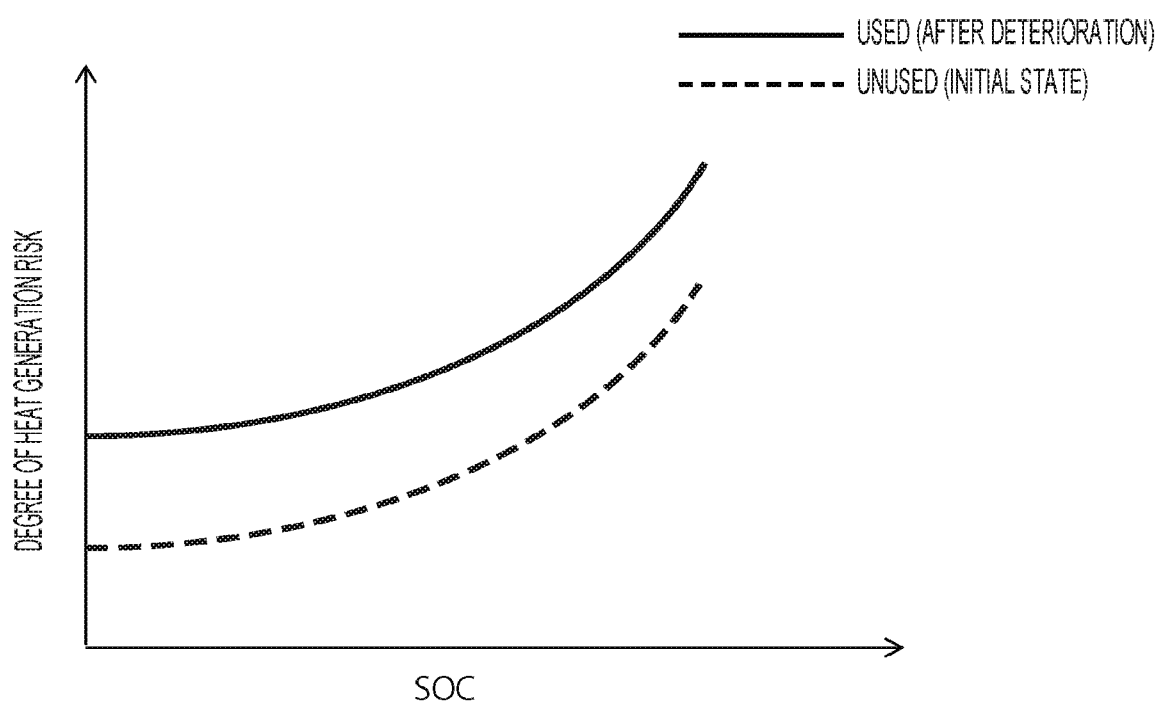
FIG. 2 is a diagram for explaining relationship between an SOC and safety.

FIG. 2 is a diagram for explaining relationship between an SOC and safety. The abscissa indicates the SOC. The ordinate indicates the degree of heat generation risk, meaning that a higher degree leads to a higher heat generation risk. Moreover, the dotted line represents a graph regarding a storage battery 1 unused, and the solid line represents a graph regarding a storage battery 1 used and having deteriorated. As illustrated in FIG. 2, the storage battery 1 used and having deteriorated exhibits a higher degree of heat generation risk. Therefore, safety of the storage battery 1 should be evaluated lower as the degree of deterioration is higher. Moreover, as illustrated in FIG. 2, the degree of heat generation risk becomes higher as the SOC becomes larger. Therefore, safety thereof should be evaluated lower as the present SOC is larger.

Hence, the battery safety evaluation apparatus 2 evaluates safety, taking account of not only the present deterioration state of the storage battery 1 but also the present SOC thereof. Thereby, the evaluation more correctly indicates present safety of the storage battery 1 than conventional one. Accordingly, this safety evaluation can be used for determining permission to carry the storage battery 1 in or to use the same in environments where safety is required. Details of estimating the present states by the battery safety evaluation apparatus 2 are mentioned later.

It is supposed that the battery safety evaluation apparatus 2 estimates the internal temperature and the like using thermal stability data. The thermal stability data will be described later. Moreover, details of processing at or after the estimation of the internal temperature and the like will be also described later.

Incidentally, the system configuration described above is exemplary, and the present invention is not limited to the aforementioned configuration. For example, as long as information necessary for a process is received from the battery safety evaluation apparatus 2 and the process result is transferred to the battery safety evaluation apparatus 2 by communication or an electric signal, a part of components of the battery safety evaluation apparatus 2 may be outside the battery safety evaluation apparatus 2. Alternatively, the battery safety evaluation apparatus 2 may be separated into a battery control apparatus including the charge/discharge controller 21, a battery state estimation apparatus including the battery state estimator 23, and the battery safety evaluation apparatus 2 including the battery safety evaluator 24. Conversely, the battery safety evaluation apparatus 2 can be regarded as a battery control apparatus and also regarded as a state estimation apparatus.

Figure 3:
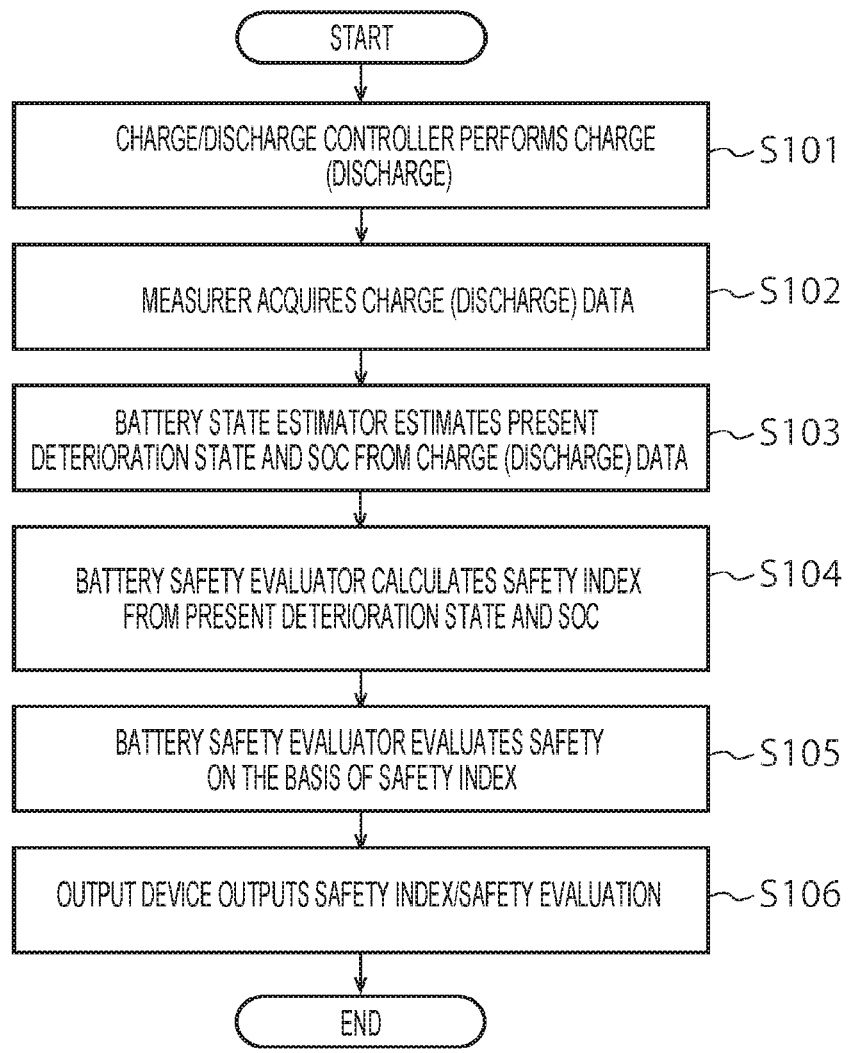
FIG. 3 illustrates an example of a flowchart on schematic processes of the battery safety evaluation apparatus.

Next, an outline of processes of the battery safety evaluation apparatus is described. FIG. 3 is a diagram illustrating an example of a flowchart on schematic processes of the battery safety evaluation apparatus. Incidentally, this flowchart is exemplary, and the order and the like of the processes are not limited as long as necessary process results can be obtained. Moreover, the process results of the individual processes may be successively stored in a storage such as the estimation data storage 233, and the individual components may acquire the process results by referring to the storage. The following flowcharts are also similar.

The charge/discharge controller 21 controls the storage battery 1 on charge (or discharge) under a predetermined condition (S101). The measurer 22 acquires charge (discharge) data (charge data in charging and discharge data in discharging) by a measurement (S102). The charge (discharge) data is data of current, voltage and the like measured in charging or in discharging, and is included in the measurement data.

The battery state estimator 23 estimates a present deterioration state and a present SOC of the storage battery 1 from the charge (discharge) data obtained by the most recent control of the charge/discharge controller 21 (S103). The battery safety evaluator 24 calculates an index for determining safety from the present deterioration state and SOC of the storage battery 1 on the basis of thermal stability data (S104). The index is expressed as safety index. Then, the battery safety evaluator 24 evaluates the safety on the basis of the safety index (S105). The evaluation is expressed as safety evaluation. The output device 25 outputs the safety index or the safety evaluation in a manner where a user or the like can recognize it (S106). For example, the safety index or the safety evaluation may be displayed on a display or the like. In this way, the safety of the storage battery 1 can be recognized.

Incidentally, the SOC changes even in minutes as the storage battery 1 is being used. The deterioration state however does not change in a shorter time than the SOC does. Therefore, in S103, within a predetermined time from the previous estimation of the deterioration state, the present deterioration state of the storage battery 1 is sufficient not to be estimated but the previous estimation value thereof may be used. For example, it is supposed that the safety evaluation is performed at time "$t_0$" and the present deterioration state of the storage battery 1 and the present SOC of the storage battery 1 have been estimated. In this case, when the safety evaluation is performed again at time "$t_0+5$" after five minutes of time "$t_0$", as the present deterioration state of the storage battery 1, the value at time "$t_0$" may be used. Meanwhile, the present SOC of the storage battery 1 may be calculated on the basis of the measurement data measured at time "$t_0+5$". The "present" in this case indicates time "$t_0+5$" which is the most recent time of measuring the measurement data.

Incidentally, the safety index may be the same as the safety evaluation. That is, the safety index may be output without the safety evaluation performed, for example, when the safety index is a numerical value, if a user or the like can determine the safety with the numerical value, the output device 25 may output the safety index without the process of the safety evaluation (S105) performed.

Next, the components in the battery safety evaluation apparatus 2 and details of processes thereof will be described.

The charge/discharge controller 21 gives the storage battery 1 an instruction to be charged or discharged. Since the charge/discharge is performed in order to measure the present state of the storage battery 1, it is supposed that the charge/discharge is periodically performed at appropriate intervals relative to the lifetime of the battery. Alternatively, the charge/discharge may be performed upon reception, by the battery safety evaluation apparatus 2, of an instruction from a user, another system or the like through an input device not illustrated in the present embodiment. Moreover, upon reception of an instruction from another component such as the battery state estimator 23, the charge/discharge may be controlled and performed based on the instruction. Moreover, the charge/discharge may be performed by a typical method such, for example, as constant-current constant-voltage charge.

The measurer 22 measures information about the storage battery 1. Examples of the information to be measured include the voltage between positive electrode terminals and negative electrode terminals of unit cells, current flowing through unit cells, and the temperatures of unit cells. The measurement data includes data of the voltage, the current, the temperature and the like of the storage battery 1 which are measured by the measurer 22. There can also be a case where charge or discharge of the storage battery 1 does not depend on the charge/discharge controller 21. For example, the storage battery 1 is discharged by use of a device including the storage battery 1. Also in this case, the measurement data is generated. The measurement data includes the charge (discharge) data.

The deterioration state estimator 231 of the battery state estimator 23 estimates the present deterioration state of the storage battery 1. In the present embodiment, estimation of the deterioration state using charge/discharge curve analysis is described.

It is preferable to use charge/discharge curve analysis for estimating the deterioration state of the storage battery 1 in the battery safety evaluation apparatus 2. For example, it is herein supposed that a device using the storage battery 1 is realized as the battery safety evaluation apparatus 2. In this case, using a charge/discharge curve analysis technology, a deterioration state of a battery in use can be grasped with high accuracy without the battery detached. That is, it is not needed to detach the storage battery 1 from the device to attach it to a measurement device. This can save some labor for the safety evaluation. Accordingly, a parameter indicating the deterioration state is preferably a parameter which can be calculated by charge/discharge curve analysis.

Note that techniques other than the charge/discharge curve analysis can be used. Examples of those include a charge or discharge experiment in which a battery capacity is measured by supplying a tentative current, a current pausing method in which an internal resistance value is mainly measured, and an electrochemical measurement such as an AC impedance measurement. Measurement may be performed by combination thereof.

The charge/discharge curve analysis calculates inner state parameters and battery characteristics (cell characteristics) of each unit cell on the basis of charge (discharge) data. Specifically, the inner state parameters are estimated on the basis of the charge (discharge) data. The battery characteristics are estimated on the basis of the estimated inner state parameters. As mentioned above, a parameter used as the deterioration state may be predetermined, and the parameter may be obtained by the charge/discharge curve analysis.

The inner state parameters each indicate the state of a unit cell. The inner state parameters are assumed to include a positive electrode capacity (the mass of the positive electrode), a negative electrode capacity (the mass of the negative electrode), an SOC deviation, and an internal resistance. The SOC deviation means a difference between the initial charge amount of the positive electrode and the initial charge amount of the negative electrode.

The battery characteristics can be calculated from the inner state parameters, and represent characteristics including the voltage of the storage battery 1. The battery characteristics include a battery capacity, an open circuit voltage (OCV), an OCV curve, and the like. The internal resistance may be included also in the battery characteristics. The OCV curve means a graph (a function) indicating the relationship between the open circuit voltage and a certain index regarding the storage battery 1. The battery capacity is within a range in which the positive electrode capacity range overlaps with the negative electrode capacity range.

It is supposed that the estimation data storage 233 beforehand stores expressions, parameters and the like needed for the charge/discharge curve analysis. For example, it stores a function indicating the relationship between the charge amount and the potential of the positive electrode or the negative electrode of a unit cell.

The deterioration state estimator 231 calculates an amount of an active material forming the positive electrode or the negative electrode of a unit cell, an initial charge amount, and the internal resistance of a unit cell, which are the inner state parameters, on the basis of data of the voltage, the current, the temperature and the like included in the measurement data. The calculation uses a function for calculating a storage battery voltage on the basis of the active material amounts and the internal resistance. First, using the function, the voltage of the storage battery 1 is calculated on the basis of current data and voltage data in charging/discharging the storage battery 1. The active material amount and the internal resistance which reduce a difference between a measured voltage and the calculated voltage of the storage battery 1 are obtained through regression calculation. The positive electrode may be made from a plurality of active materials. However, in the present embodiment, an example of a secondary battery having a positive electrode and a negative electrode each made from one active material is explained.

When the secondary battery having a positive electrode and a negative electrode each made from one active material is charged, a voltage (a terminal voltage) "$V_t$" at time "t" is expressed by the following expression.

[Expression 1]

$$V_t = f_c\left(q_0^c + \frac{q_t}{M_c}\right) - f_a\left(q_0^a + \frac{q_t}{M_a}\right) + RI_t \quad (1)$$

"$I_t$" represents a current value at time "t", and "$q_t$" represents a charge amount of the secondary battery at time "t". "$f_c$" represents a function showing the relationship between the charge amount and the potential of the positive electrode, and "$f_a$" represents a function showing the relationship between the charge amount and the potential of the negative electrode. "$q_o^c$" represents the initial charge amount of the positive electrode, and "$M_c$" represents the mass of the positive electrode. "$q_o^a$" represents the initial charge amount of the negative electrode, and "$M_a$" represents the mass of the negative electrode. "R" represents the internal resistance.

As the current value "$I_t$", the current value included in the measurement data is used. The charge amount "$q_t$" is calculated by time-integrating the current value "$I_t$". The functions "$f_c$" and "$f_a$" are assumed to be stored as function information in the estimation data storage 233.

Five values (a parameter set), the initial charge amount "$q_o^c$" of the positive electrode, the mass "$M_e$" of the positive electrode, the initial charge amount "$q_o^a$" of the negative electrode, the mass "$M_a$" of the negative electrode, and the internal resistance "R" are estimated through regression calculation. Incidentally, the active material amount of each of the electrodes may be calculated by regarding the amount as a predetermined ratio of the mass of the electrode.

Figure 4:
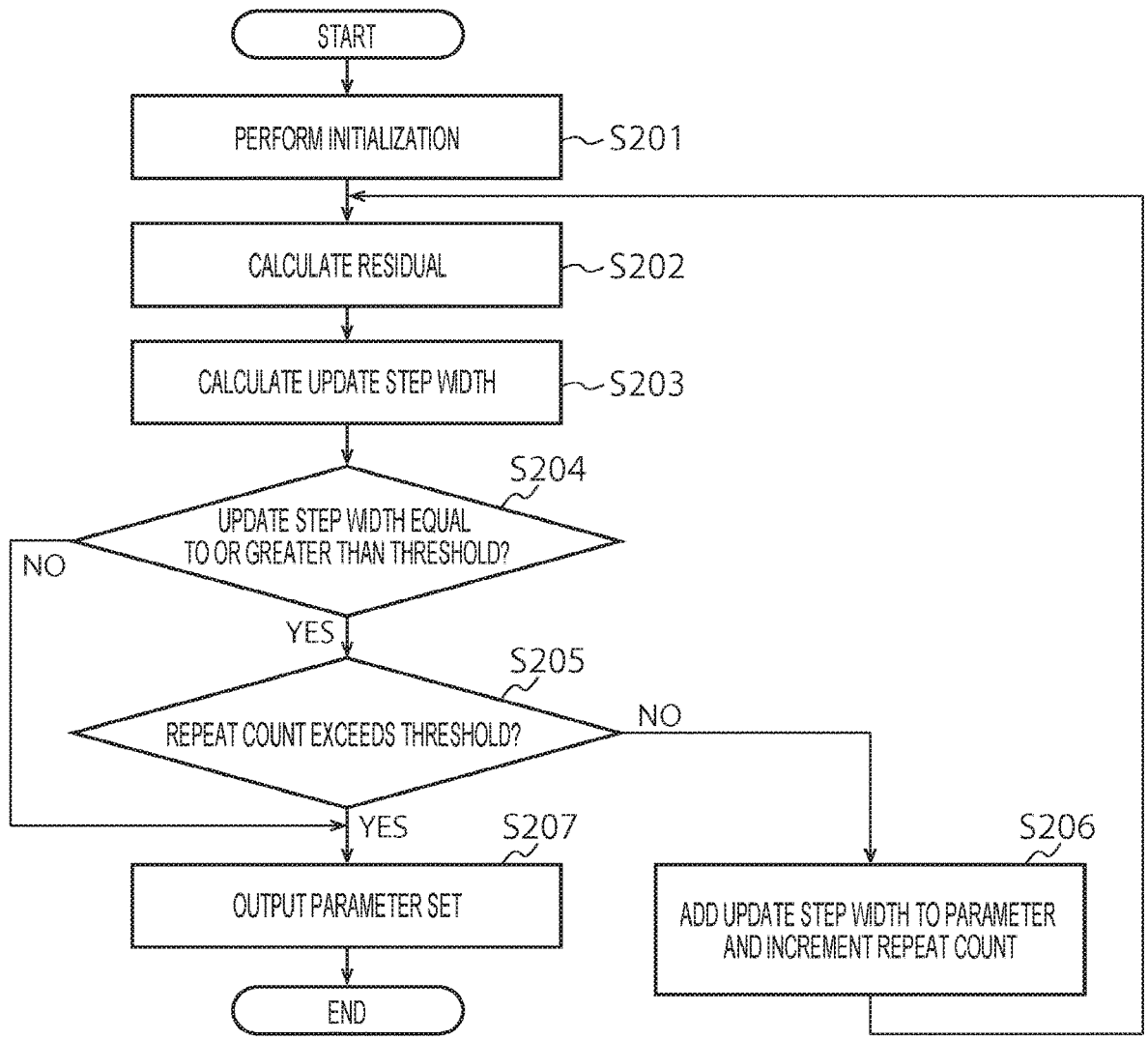
FIG. 4 illustrates an example of a flowchart of an inner state parameter calculation process.

FIG. 4 illustrates an example of a flowchart of a calculation process to be performed by the inner-state parameter. The deterioration state estimator 231 performs initialization to set initial values for the aforementioned parameter set and to set the repeat count of regression calculation to zero (S201). The initial value, for example, may be a value calculated when the previous process of calculating the active material amount, or may be an expectable value.

The deterioration state estimator 231 calculates a residual E which is expressed by the following expression (S202).

[Expression 2]

$$E = \sum_{t=0}^{t_{end}} (V_{bat\_t} - V_t)^2 = \sum_{t=0}^{t_{end}} \left(V_{bat\_t} - \left(f_c\left(q_0^c + \frac{q_t}{M_c}\right) - f_a\left(q_0^a + \frac{q_t}{M_a}\right) + RI_t\right)\right)^2 \quad (2)$$

wherein "$V_{bat\_t}$" represents the terminal voltage at time "t", and "$t_{end}$" represents a charge end time.

The deterioration state estimator 231 calculates an update step width of the parameter set (S203). The update step width of the parameter set can be calculated by method, such as a Gauss-Newton method, a Levenberg-marquardt method.

The deterioration state estimator 231 determines whether the update step width is less than a predetermined width (S204). When the update step width is less than the predetermined width (No at S204), the deterioration state estimator 231 determines that the calculation has converged, and outputs the present parameter set (S207). When the update step width is equal to or greater than a predetermined threshold (Yes at S204), whether the repeat count of regression calculation is greater than a predetermined value is checked (S205).

When the repeat count of regression calculation is greater than the predetermined value (Yes at S205), the present parameter set is outputted (S207). When the repeat count of regression calculation is equal to or less than the predetermined value (No at S205), the update step width calculated at S203 is added to the parameter set and the repeat count of regression calculation is incremented by one (S206). Subsequently, the process returns to calculation of the residual (S202). The flowchart illustrating the flow of the calculation process to be performed by the inner-state parameter has been described above.

When the battery characteristic is used as a parameter of the deterioration state, the battery characteristic is further calculated from the inner state parameter. As an example, a case of calculating the open circuit voltage which is a battery characteristic of the storage battery 1 is described. The deterioration state estimator 231 calculates the relationship between the charge amount of the storage battery 1 and the open circuit voltage by using the initial charge amount "$q_o^c$" of the positive electrode, the mass "$M_c$" of the positive electrode, the initial charge amount "$q_o^a$" of the negative electrode, and the mass "$M_a$" of the negative electrode.

Figure 5:
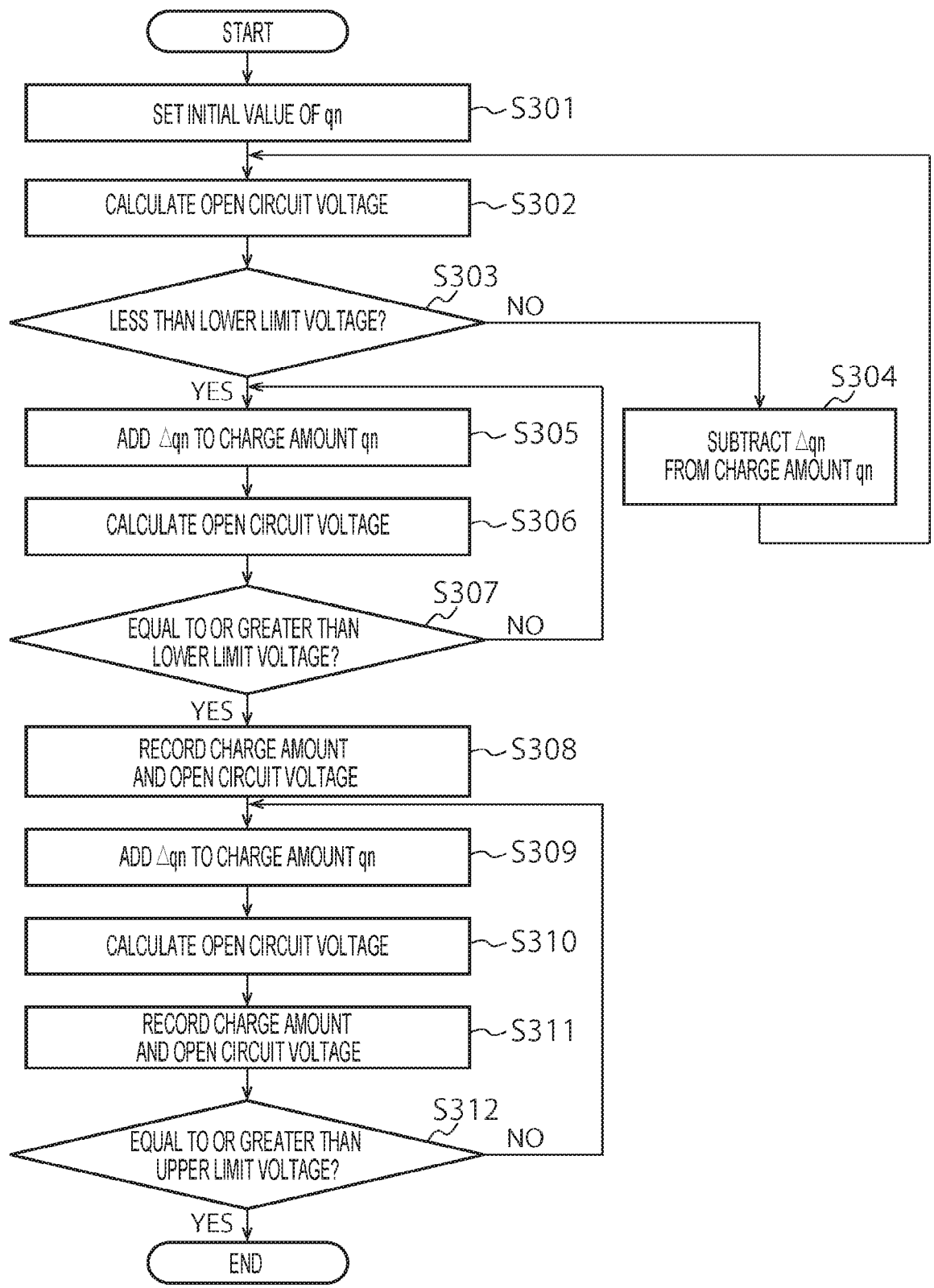
FIG. 5 illustrates an example of a flowchart illustrating a flow of a battery characteristic calculation process.

FIG. 5 illustrates an example of a flowchart illustrating a flow of a battery characteristic calculation process. The flowchart starts after the inner-state parameter is calculated. In this flowchart, the charge amount $q_n$ is increased and decreased by a predetermined value $\Delta q_n$, the charge amount $q_{n0}$ is found at which the open circuit voltage exceeds the lower limit, and $q_n$ is increased by $\Delta q_n$ from $q_{n0}$ as an initial value until the open circuit voltage exceeds the upper limit, and the charge amount and the open circuit voltage are recorded every time the increase is performed. Accordingly, the relationship between the charge amount and the open circuit voltage in a range from the lower limit to the upper limit of the open circuit voltage can be calculated. The difference between the charge amount $q_{n0}$ and the charge amount $q_n$ at which the open circuit voltage is the upper limit is a battery capacity.

The deterioration state estimator 231 sets the initial value of the charge amount $q_n$ (S301). The initial value of $q_n$ may be set to zero or to a value which is less than zero by a few percent of the nominal capacity of the storage battery 1. Specifically, if the nominal capacity of the storage battery 1 is 1000 mAh, the initial value of $q_n$ may be set within a range of approximately −50 mAh to 0 mAh.

The deterioration state estimator 231 calculates the open circuit voltage (S302). To calculate the open circuit voltage, the following expression can be used.

[Expression 3]

$$E_n = f_c\left(q_0^c + \frac{q_n}{M_c}\right) - f_a\left(q_0^a + \frac{q_n}{M_a}\right) \quad (3)$$

Next, the deterioration state estimator 231 compares the calculated open circuit voltage with a predetermined lower limit voltage (S303). The lower limit voltage is defined on the basis of combination of the positive electrode active material and the negative electrode active material used in the storage battery 1. Specifically, in terms of each of the safety, the lifetime, the resistance, or the like, the appropriate usage ranges of the voltage for the positive electrode active material and the negative electrode active material are defined, and the combination of the ranges is used to determine the lower limit and the upper limit of the usage range for the storage battery.

When the open circuit voltage is not less than the predetermined lower limit voltage (No at S303), $\Delta q_n$ is subtracted from the charge amount $q_n$ (S304) and the open circuit voltage is calculated again (S302). When the open circuit voltage is less than the predetermined lower limit voltage (Yes at S303), the deterioration state estimator 231 adds $\Delta q_n$ to the charge amount $q_n$ (S305). In this way, the charge amount $q_n$ approximates to the lower limit value. A value of $\Delta q_n$ can be determined as proper. For example, $\Delta q_n$ may be set to approximately 1/1000 to 1/100 of the nominal capacity of the storage battery 1. Specifically, if the nominal capacity of the storage battery 1 is 1000 mAh, $\Delta q_n$ may be set to a range of approximately 1 mAh to 10 mAh.

The deterioration state estimator 231 calculates the open circuit voltage by using the added charge amount $q_n+\Delta q_n$ (S306). Subsequently, the deterioration state estimator 231 compares the calculated open circuit voltage with the aforementioned lower limit voltage (S307). When the open circuit voltage is lower than the lower limit voltage (No at S307), the process returns to S305 and $\Delta q_n$ is added to the charge amount $q_n$ again (S305). When the open circuit voltage is equal to or higher than the lower limit voltage (Yes at S307), the charge amount $q_n$ at that time is set to $q_{n0}$ because the open circuit voltage has exceeded the lower limit value, and the charge amount $q_{n0}$ and the open circuit voltage En are recorded together (S308). Incidentally, the value of the charge amount $q_{n0}$ may be set as a reference value and expressed by "0". In this case, the value obtained by subtracting the value of $q_{n0}$ from the value of the charge amount $q_n$, in subsequent recording.

The deterioration state estimator 231 adds $\Delta q_n$ to the charge amount $q_n$ (S309), calculates the open circuit voltage (S310), and records the calculated open circuit voltage En and the value obtained by subtracting $q_{n0}$ from the charge amount $q_n$ (S311).

The deterioration state estimator 231 compares the calculated open circuit voltage with the predetermined upper limit voltage of the storage battery 1 (S312). The upper limit voltage of the storage battery 1 is defined on the basis of combination of the positive electrode active material and the negative electrode active material used in the storage battery 1. When the open circuit voltage is lower than the predetermined upper limit voltage (No at S312), the process returns to adding of $\Delta q_n$ to the charge amount again (S309). When the open circuit voltage is equal to or higher than the predetermined upper limit voltage (Yes at S312), the process is ended. The flowchart illustrating a flow of a battery characteristic calculation process has been described.

Figure 6A:
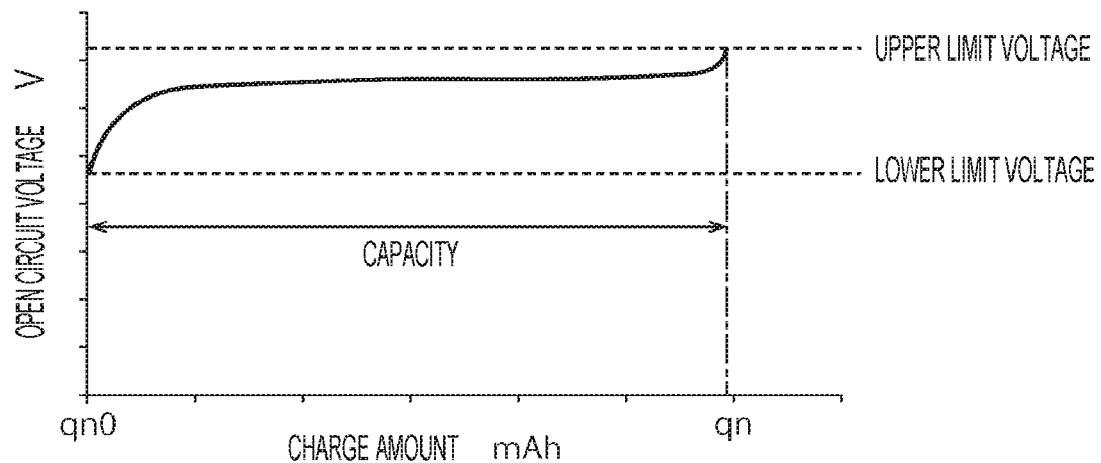
FIGS. 6A and 6B illustrate an example of graphs (charge amount-OCV curves) illustrating the relationships between a charge amount and an open circuit voltage.
Figure 6B:
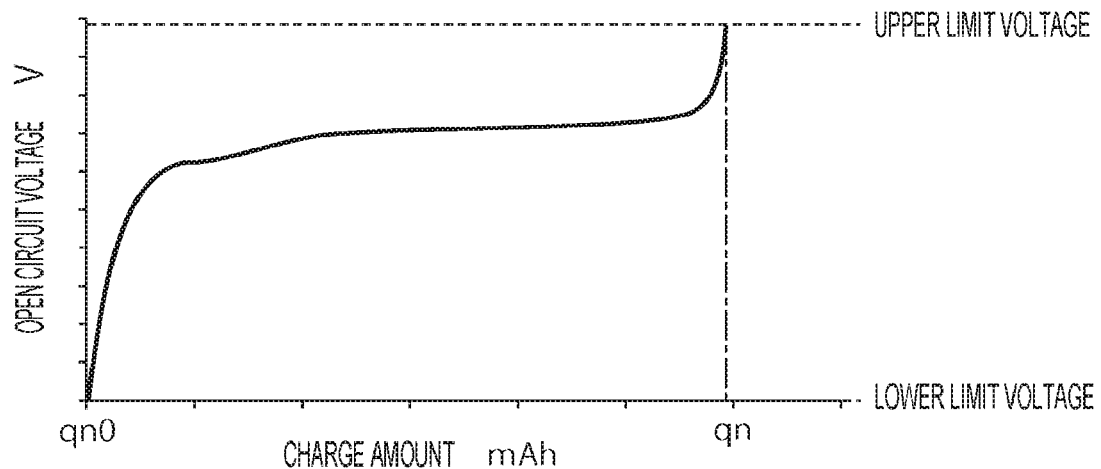

FIGS. 6A and 6B illustrate an example of graphs (charge amount-OCV curves) illustrating the relationships between a charge amount and an open circuit voltage. FIG. 6A illustrates a charge amount-OCV curve at the present state calculated by the deterioration state estimator 231. FIG. 6B is a diagram obtained by taking out a range from the lower limit voltage to the upper limit voltage of the ordinate, from the graph illustrated in FIG. 6A.

The deterioration state estimator 231 may further calculate other battery characteristics. For example, the deterioration state estimator 231 may calculate the voltage, the power or the power amount of the storage battery 1 by using the calculated open circuit voltage or the like. As the calculation method, for example, calculation expressions below may be used. In the following calculation expressions, "c" represents a predetermined constant.

(Voltage)

voltage=open circuit voltage−c×internal resistance× current (Power)

power=current×open circuit voltage−c×internal resistance×(current)$^2$ (Power Amount)

power amount=battery capacity×average voltage

Incidentally, an estimation value calculated as the inner state parameter can be used as the internal resistance. In this case, since the internal resistance changes depending on the temperature and the like, the internal resistance may be corrected with the present temperature. Moreover, the deterioration state estimator 231 may recalculate a battery characteristic, which has been calculated, by using the corrected estimation value. Thereby, accuracy of estimating the deterioration state can be improved.

Such correction of the internal resistance may be performed using the known method, for example, disclosed in Japanese Patent Laid-Open No. 2017-166874 and the like. For example, the internal resistance is divided into three components, which are a reaction resistance "Rct", a diffusion resistance "Rd" and an ohmic resistance "Rohm". They are corrected in accordance with the unique temperature dependencies, and then, are summed up. Thereby, the internal resistance corresponding to the present temperature can be calculated.

The SOC estimator 232 estimates the present SOC of the storage battery 1. The SOC may be estimated using the inner state parameters and the battery characteristics calculated by the deterioration state estimator 231. For example, the present SOC can be calculated by converting the charge amount-OCV curve estimated by the deterioration state estimator 231 into an SOC-OCV curve. The charge amount may be converted into the SOC by using the battery capacity and the charge amount calculated from the charge amount-OCV curve. Moreover, in place of the deterioration state estimator 231, the SOC estimator 232 may calculate the charge amount-OCV curve from the inner state parameters.

Figure 7:
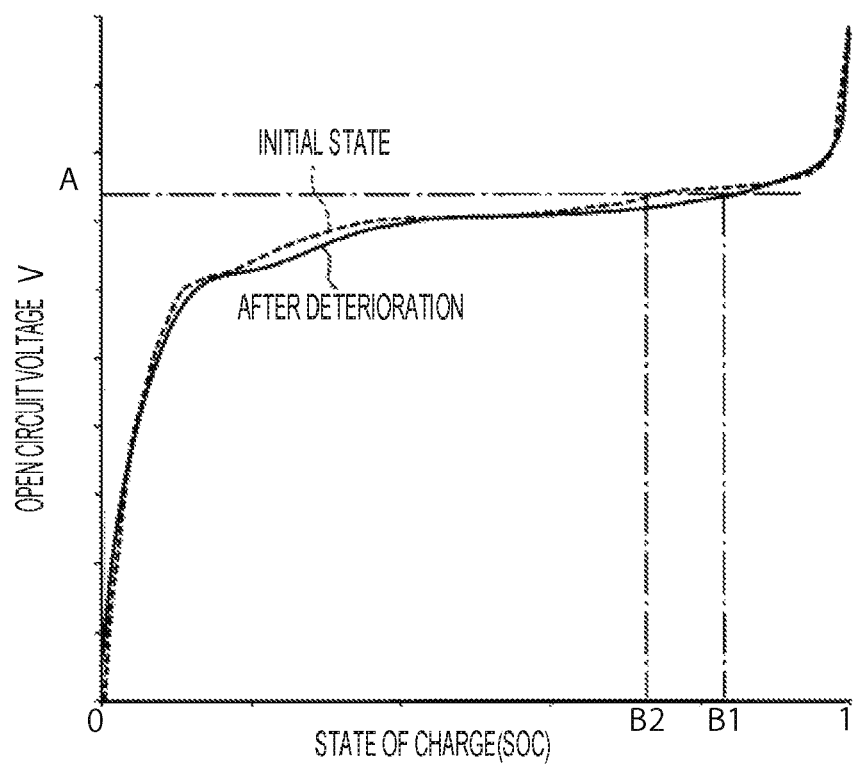
FIG. 7 illustrates an example of a graph (SOC-OCV curve) illustrating the relationship between an SOC and an open circuit voltage.

FIG. 7 illustrates an example of a graph (an SOC-OCV curve) illustrating the relationship between an SOC and an open circuit voltage. FIG. 7 differs from FIGS. 6A and 6B in that the abscissa in FIG. 7 indicates not the charge amount but the SOC. In FIG. 7, a graph (a solid line) obtained by converting the graph illustrated in FIG. 6B into a SOC-OCV curve and the SOC-OCV curve (a broken line) of the storage battery at the initial state are overlapped. In FIG. 7, the broken line represents the open circuit voltage of the storage battery at the initial state, and the solid line represents the open circuit voltage of the storage battery after change (present time) due to deterioration of the storage battery or the like. The SOC indicates the ratio of the present charge amount with respect to the full charge capacity, and is expressed by a value from 0 to 1, or 0 to 100%.

The length of the curve after change becomes shorter as the capacity decreases. However, FIG. 7 illustrates that not only the length but also the shape of the curve changes. For example, in the case where SOC is estimated on the basis of the open circuit voltage, when the measured open circuit voltage is A, the normal charge state (the present state of charge) is B1. However, if the curve of the open circuit voltage is considered not to change, that is, if the open circuit voltage is to be obtained from the SOC-OCV curve at the initial state, B2 is obtained as the charge state at the voltage A, and thus, efficiency in estimation of the charge state is deteriorated. Therefore, by using the SOC-OCV curve at the present state, not the SOC-OCV curve at the initial state without deterioration, the present SOC can be accurately calculated. That is, the battery safety evaluation apparatus 2 which estimates the present SOC using the SOC-OCV curve at the present state can more accurately calculate the present SOC than another apparatus that estimates the SOC using a predetermined SOC-OCV curve.

The case where the positive electrode and the negative electrode of the secondary battery are each formed from one kind of an active material has been described herein. However, the present invention can be similarly applied to a secondary battery in which any or both of the positive electrode and the negative electrode of the secondary battery are formed from a plurality of kinds of active materials.

Incidentally, in the case where the value at time "$t_0$" is used for the present deterioration state of the storage battery 1 and the value at time "$t_0+5$" is used for the present SOC of the storage battery 1, the value of the SOC calculated from the SOC-OCV curve at time "$t_0$" is corrected with measurement data from time "to" to time "$t_0+5$". For example, the discharge amount from time "$t_0$" to time "$t_0+5$" is calculated from the measurement data to update the charge amount of the storage battery 1, and the SOC is calculated with the updated the charge amount. As above, the charge (discharge) data is not needed to be the most recent measurement data.

The battery safety evaluator 24 estimates a calorific value in the case where the storage battery 1 is supposed to generate heat from the present state of the storage battery 1 estimated by the battery state estimator 23. Then, it further estimates the temperature of the storage battery 1 in accordance with this calorific value. Further, safety of the storage battery 1 is evaluated on the basis of the estimated temperature of the storage battery 1. Details thereof will be described with description of the components of the battery safety evaluator 24.

The components of the battery safety evaluator 24 are described. The thermal stability data storage 241 stores thermal stability data needed in calculating safety of the storage battery 1. Incidentally, data other than the thermal stability data may be stored therein. For example, the thermal stability data storage 241 may store the specific heat of the storage battery 1, a heat transfer coefficient at the time when the storage battery 1 emits calories to an external environment, and the like. These data are used for the processes regarding the safety index calculator 244. In addition, it may store constraint conditions and the like used for the processes of the battery safety evaluator 24. For example, the thermal stability data storage 241 may store an SOC range applied to the storage battery 1 as a condition of use. The calculated safety index and the like may be stored therein.

The thermal stability data is data regarding heat generation of a secondary battery in the case where the secondary battery is exposed to high temperature. The thermal stability data at least indicates relationship between a calorific value of the secondary battery and an external temperature. For example, the thermal stability data may be a DSC (differential scanning calorimetry) curve measured by a differential scanning calorimeter. Incidentally, the external temperature means a temperature in the external environment of the secondary battery, and may be the temperature of an adjacent cell or the temperature of a surrounding space.

It is supposed that the thermal stability data storage 241 stores a plurality of thermal stability data which are categorized for deterioration states of secondary batteries. Thereby, thermal stability data in accordance with a deterioration state of the storage battery 1 can be selected. In other words, the thermal stability data regarding the secondary battery that is supposed to be the same in deterioration state as the storage battery 1 is selected. For example, when the storage battery 1 is unused, the thermal stability data regarding the unused secondary battery is selected from the thermal stability data stored in the thermal stability data storage 241. Alternatively, when a parameter indicating the deterioration state, such as the capacity (mass) of the positive electrode or the negative electrode, is within a predetermined range, the thermal stability data regarding the secondary battery that is relevant to the predetermined range is selected.

Incidentally, the thermal stability data may be further narrowed down to one to be used, using a feature other than the value of the parameter indicating the deterioration state. For example, when it has become clear that metal (lithium for a lithium ion secondary battery) is deposited in the storage battery 1 due to deterioration, thermal stability data created from a secondary battery in which metal is deposited may be used. Therefore, thermal stability data may be categorized for such features.

Furthermore, the thermal stability data is supposed to be categorized for values of the SOC. Thermal stability data to be used is determined on the basis of the present SOC estimated by the battery state estimator 23. For example, when the value of the SOC is estimated to be 70%, the thermal stability data in which the SOC is relevant to 70% is used. Thereby, evaluation in accordance with the present SOC is performed. Incidentally, classes of the SOC may be categorized for fixed ranges which are, for example, 0% to 20%, 20% to 30%, and so on.

The thermal stability data may be expressed as a graph or a function. For example, the thermal stability data may be a graph indicating relationship between the external temperature of a secondary battery and the calorific value of the secondary battery. Moreover, an approximation function of the graph may be used as the thermal stability data.

The thermal stability data is supposed to be categorized for the individual electrodes of the secondary battery. That is, the thermal stability data may include thermal stability data pertaining to the positive electrode of the secondary battery, and thermal stability data pertaining to the negative electrode of the secondary battery.

Figure 8:
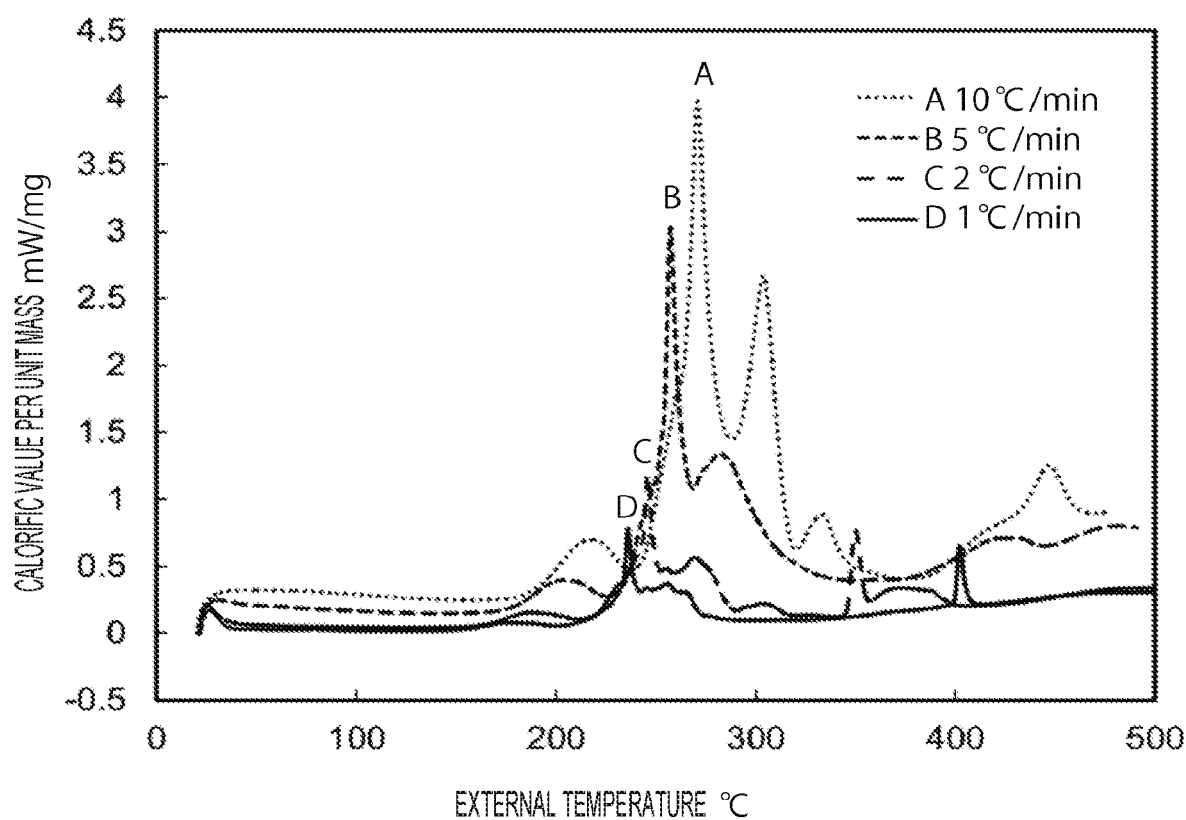
FIG. 8 illustrates an example of thermal stability data.

FIG. 8 exemplarily illustrates a diagram of the thermal stability data. FIG. 8 illustrates graphs in which the thermal stability data are plotted. The graph regarding the thermal stability data as illustrated in FIG. 8 is expressed as calorific value calculation graph. The ordinate indicates the calorific value per mass. The abscissa indicates the external temperature. The calorific value calculation graph in FIG. 8 is a DSC curve. As shown in FIG. 8, the thermal stability data includes the calorific value per mass, a heat generation start temperature and the like. The mass in the calorific value per mass means the sum total of the active material amount of the positive electrode or the negative electrode, the mass of the positive electrode or the negative electrode, or the mass of the positive electrode or the negative electrode and the mass of the electrolytic solution. Such thermal stability data exists for each of the deterioration states and for each of the values of the SOCs.

At the external temperature of the peak of the DSC curve, the secondary battery has a large calorific value and tends to fire. That is, this external temperature at the peak is a thermal runaway temperature. Incidentally, four graphs in FIG. 8 have different temperature elevating speeds of the external temperature. In the graph A, the external temperature is elevated at 10° C. per minute. In the graph B, the external temperature is elevated at 5° C. per minute. In the graph C, the external temperature is elevated at 2° C. per minute. In the graph D, the external temperature is elevated at 1° C. per minute. As above, the calorific value, the timing of thermal runaway, and the like are different also depending on the temperature elevating speed. The temperature elevating speed of the external temperature may be determined in accordance with required safety, the configuration of the storage battery 1, the surrounding environment, and the like. In the present embodiment, the temperature elevating speed may be designated via a not-shown input device.

The thermal stability data is supposed to be beforehand created on the basis of measurement data of a plurality of secondary batteries. The plurality of secondary batteries used for creating the thermal stability data are supposed to be secondary batteries which satisfy the same prerequisite conditions. Then, the thermal stability data is versatilely used for other secondary batteries which satisfy the prerequisite conditions.

The prerequisite conditions are not specially limited but there are supposed to be various prerequisite conditions. For example, such prerequisite conditions may be materials used for electrodes of secondary batteries, active material amounts of the electrodes being within predetermined ranges, and the similar factors. Then, a plurality of secondary batteries which satisfy the prerequisite conditions are inspected, and the thermal stability data is calculated on the basis of inspection results. Incidentally, a method of creating the thermal stability data is not specifically limited but may be defined as proper.

Alternatively, an unused state, a state where metal is deposited, and the similar state may be regarded as prerequisite conditions. Alternatively, a matter regarding a preservation or use environment of a secondary battery may be regarded as a prerequisite condition. As a prerequisite condition regarding the environment, the temperature, the humidity, or the like may be used. For example, also a matter regarding the use history of a secondary battery may be used as a prerequisite condition. As a prerequisite condition regarding the use history, the number of performing charge or discharge, the total use time, or the like may be used.

As the causes of deterioration of a secondary battery, the reactivity with an electrolyte, a damage due to expansion or contraction of an active material, or the like may be expected. However, specifying the cause of deterioration of a secondary battery is difficult. The deterioration condition varies according to the storage condition, the use history, or the like of a secondary battery. Therefore, thermal stability data is beforehand calculated for each of various prerequisite conditions, and the thermal stability data matching the state of the storage battery 1 is used. That is, the thermal stability data calculated on the basis of the inspection result of a secondary battery in the similar state to the state of the storage battery 1 is used. Thereby, the calorific value of the storage battery 1 can be estimated with excellent accuracy.

The thermal stability data acquirer 242 acquires the estimation value of the present deterioration state and the estimation value of the present SOC from the battery state estimator 23. Then, the thermal stability data acquirer 242 selects and acquires thermal stability data corresponding to the storage battery 1 from the thermal stability data of a plurality of secondary batteries stored in the thermal stability data storage 241 at least on the basis of these acquired estimation values. Therefore, the acquired thermal stability data is selected on the basis of the estimation value of the present deterioration state of the storage battery 1 and the estimation value of the present SOC of the storage battery 1, the thermal stability data being regarded as corresponding to the storage battery 1.

Incidentally, the thermal stability data is also expressed as "reference data" since it is data referred to when calculating the calorific value of the secondary battery. Moreover, out of the thermal stability data acquired by the thermal stability data acquirer 242, that is, a plurality of reference data, reference data selected on the basis of the estimation value of the present deterioration state of the storage battery 1 and the estimation value of the present SOC of the storage battery 1, the reference data being regarded as corresponding to the storage battery 1, is also expressed as "first reference data". When the calorific value of the storage battery 1 is calculated, the first reference data is referred to.

Incidentally, it is supposed that the thermal stability data corresponding to the storage battery 1 includes thermal stability data corresponding to the positive electrode of the storage battery and thermal stability data corresponding to the negative electrode of the storage battery 1. That is, the thermal stability data acquirer 242 may acquire the thermal stability data corresponding to the positive electrode on the basis of the estimation value regarding the positive electrode. It may acquire the thermal stability data corresponding to the negative electrode on the basis of the estimation value regarding the negative electrode.

When the estimation value of the storage battery 1 satisfies the prerequisite condition of a secondary battery in the occasion of beforehand creating the thermal stability data, the relevant thermal stability data can be regarded as corresponding to the storage battery 1. For example, in the case where the thermal stability data has been created on the basis of a plurality of secondary batteries satisfying a prerequisite condition that the active material amount of the positive electrode is within a predetermined range, when the estimation value on the active material amount of the positive electrode of the storage battery 1 is within the predetermined range, the relevant thermal stability data can be regarded as corresponding to the storage battery 1. Moreover, the thermal stability data corresponding to the storage battery 1 can be regarded as thermal stability data suitable for calculating the calorific value of the storage battery 1.

Incidentally, the thermal stability data acquirer 242 may acquire the thermal stability data further on the basis of an estimation value other than the deterioration state and the SOC. Thermal stability data matching a plurality of estimation values is highly possibly thermal stability data more matching the storage battery 1 than thermal stability data matching one estimation value. Therefore, in the case of using the thermal stability data matching a plurality of estimation values, the accuracy of the calculated safety index and safety evaluation is considered to be improved more than in the case of using the thermal stability data matching one estimation value.

The calorific value estimator 243 calculates the calorific value of the storage battery 1 on the basis of the thermal stability data which is acquired by the thermal stability data acquirer 242 and is regarded as corresponding to the storage battery 1.

Incidentally, the calorific value estimator 243 may calculate the calorific value of the positive electrode of the storage battery 1 on the basis of the thermal stability data which is regarded as corresponding to the positive electrode of the storage battery 1. It may calculate the calorific value of the negative electrode of the storage battery 1 on the basis of the thermal stability data which is regarded as corresponding to the negative electrode of the storage battery 1. Then, the sum of the calorific values of the positive electrode and the negative electrode of the storage battery 1 may be set to be the calorific value of the storage battery 1. Alternatively, only the calorific value of the positive electrode or the negative electrode may be used for the calorific value of the storage battery 1.

For example, the case of estimating the calorific value using the calorific value calculation graph illustrated in FIG. 8 is described. The calorific value estimator 243 obtains the area of a peak portion included in a predetermined range of the external temperature. Since the calorific value is indicated as the area of the peak portion in the DSC curve, the calorific value is obtained as the integrated value of the calorific value calculation graph in the time range (from temperature at which the heat generation starts to temperature at which the heat generation ends) of the peak. The temperature at which the heat generation starts, that is, the start point of the peak may be set to be a temperature at which the inclination of the DSC curve exceeds a threshold (rising temperature of the peak). Alternatively, it may be set to be a temperature at the intersection of a tangential line of the peak and the baseline. The end point of the peak, that is, the temperature at which the heat generation ends may be obtained as in the heat generation start temperature. In this way, the calorific value is obtained from the thermal stability data.

The predetermined range of the external temperature may be defined as proper. However, when safety of a cell in the case of firing of the adjacent cell is evaluated, the external temperature is preferably set to be close to a temperature which the cell is supposed to be exposed to in the case of firing of the adjacent cell, in order to perform effective evaluation thereof. As above, the calorific value of the storage battery 1 in the occasion when the external temperature changes within the predetermined range is obtained.

Incidentally, a threshold for determining whether or not thermal runaway will happen (thermal runaway determination threshold) may be predefined, and the calorific value estimator 243 may determine that thermal runaway will happen when the calorific value per unit mass exceeds the thermal runaway determination threshold.

Incidentally, to obtain, every time, the calorific value from the calorific value calculation graph as above takes load and time. Therefore, data in which the parameter indicating the deterioration state estimated by the battery state estimator 23 is associated with the calorific value and the like may be used. That is, the thermal stability data may be data (association table) indicating association of the parameter indicating the deterioration state with each item in the thermal stability data. The table may be created by an external device, or may be created on the basis of a past process history by the battery safety evaluator 24.

When the thermal stability data is the association table, the calorific value estimator 243 may refer to the table and extract the calorific value and the like corresponding to the parameter of the acquired deterioration state.

The safety index calculator 244 calculates a temperature of the storage battery 1 in the occasion when the external temperature changes within a predetermined range on the basis of the estimated calorific value of the storage battery 1. The calculated temperature of the storage battery 1 is expressed as end-point cell temperature.

The temperature change of the storage battery 1 is obtained as follows: subtracting calories (radiation amount) emitted from the storage battery 1 to the external environment from the calorific value of the storage battery 1; and dividing the obtained difference in the subtracting by the specific heat of the storage battery 1. The radiation amount is obtained from the production of the heat transfer coefficient and the difference which is obtained by subtracting the external temperature from the temperature of the storage battery 1. The heat transfer coefficient is defined by the structures, the materials and the like of cells and an assembled battery. As above, the temperature of the first battery in the occasion when the external temperature changes within the predetermined range is calculated on the basis of the calorific value of the storage battery 1, the specific heat of the storage battery 1, the heat transfer coefficient to the outside, and the external temperature.

Incidentally, the end-point cell temperature may be expressed in an absolute value or may be expressed in a relative value. That is, the end-point cell temperature may be an actual cell temperature or may be a difference from the temperature of a cell (initial temperature) at the time when the cell starts to be exposed to the supposed high temperature.

Then, the safety index calculator 244 calculates the end-point cell temperature or a calculation value regarding the end-point cell temperature as a safety index. For example, the temperature change amount from the heat generation start temperature to the end-point cell temperature may be set to be the safety index. A time taken from the heat generation start temperature to the end-point cell temperature may be set to be the safety index. A heat generation speed from the heat generation start temperature to the end-point cell temperature may be set to be the safety index. The heat generation speed may be set to be a value obtained by dividing the temperature change amount by a time needed for the temperature change.

The safety evaluator 245 determines safety of the storage battery 1 on the basis of the calculated safety index. For example, the safety index may be compared with a threshold for the safety index. The threshold for the safety index is expressed as safety threshold. The safety threshold is sufficient to be predefined.

For example, safety evaluation may be two of being safe and not being safe (dangerous) with the safety threshold being as a reference. Alternatively, with a plurality of safety thresholds, the safety evaluation may be categorized into a plurality of types such, for example, as safe, attention, warning, and stop. For example, "safe" may be determined when the end-point cell temperature which is the safety index is lower than a first safety threshold, "attention" may be determined when the end-point cell temperature is not less than the first safety threshold and lower than the second safety threshold, and "danger" may be determined when the end-point cell temperature is not less than the second safety threshold. As above, the safety evaluator 245 may select an evaluation class matching the storage battery 1 from a plurality of evaluation classes on the basis of the safety index and the safety threshold(s). To provide such evaluation classes which are easy for a user to understand enhances convenience for the user.

However, criteria for being safe or dangerous depend on requested safety. Therefore, in the safety evaluation as above, the safety threshold is needed to be changed depending on a circumstance. For example, since the safety is strongly requested when boarding an aircraft, it is needed to define a safety threshold with which the safety evaluation is strict. On the contrary, since the safety in boarding an aircraft is not requested on a daily basis, it is not needed to use the same safety threshold as that for an aircraft. Therefore, the safety threshold is needed to properly be used depending on such circumstances. In order to prevent inconvenience as above, the safety may be evaluated with a numerical value. For example, when the safety index is not more than the lower limit of a predetermined range, the safety is set to be 100% (0% of degree of risk). When the safety index is not less than the upper limit of the predetermined range, the safety is set to be 0% (100% of degree of risk). Further, when the safety index is between the lower limit and the upper limit, the evaluation is made to be a numerical value between 0% to 100%. A numerical value (safety standard) different depending on the circumstance can be designated, so that an airline company can request 70% or more of safety, and a railway company can request 50% or more of safety. Moreover, with such a numerical value, a user can recognize how the present safety is.

Incidentally, the safety index calculated by the safety index calculator 244 may be used for safety evaluation as it is. That is, the safety index calculator 244 may hand over the safety index as it is to the output device 25 as the safety evaluation. In this case, the safety index calculator 244 is also considered as the safety evaluator 245. Moreover, also when the safety index is used for the safety evaluation as it is, the safety evaluation may be regarded as being calculated on the basis of the safety index.

Incidentally, when the calorific value calculator does not determine that thermal runaway will happen, the safety index calculator 244 does not have to calculate the safety index. Then, when the safety index is not calculated, the safety evaluator 245 may determine "safe", "100% of safety" or "0% of degree of risk" as thermal runaway of the storage battery 1 not happening.

Figure 9:
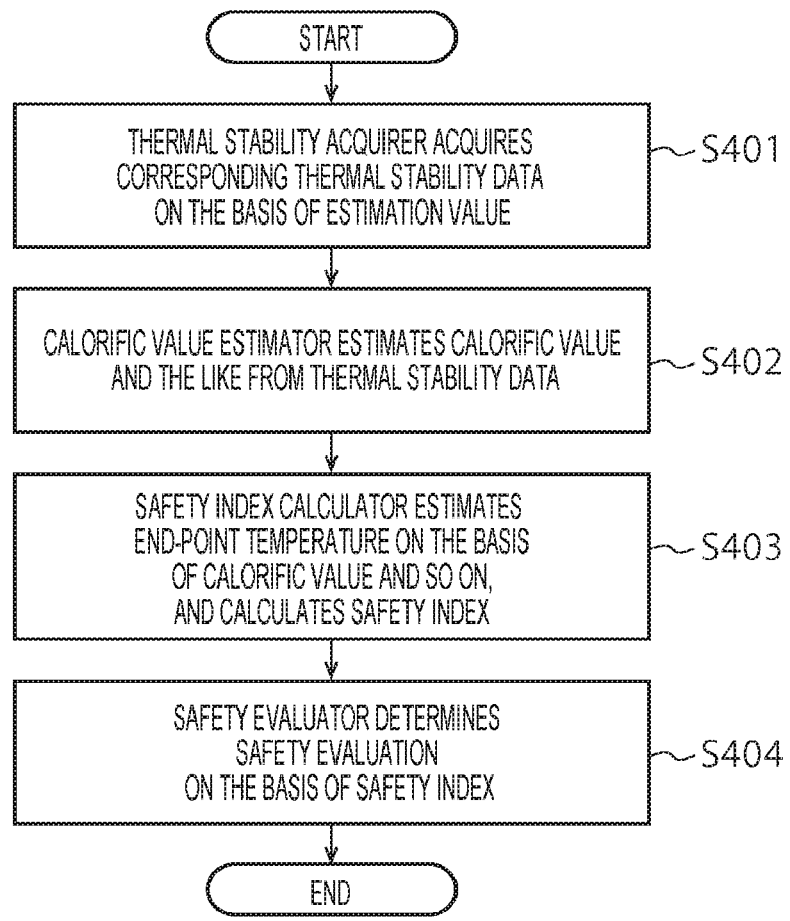
FIG. 9 illustrates an example of a flowchart of a battery safety evaluation process.

FIG. 9 is a diagram illustrating an example of a flowchart of the battery safety evaluation process. The battery safety evaluation process is performed after calculating the estimation value of the battery characteristic and the like of the storage battery 1 by the battery state estimator 23.

The thermal stability data acquirer 242 acquires thermal stability data corresponding to the storage battery 1 from the thermal stability data storage 241 on the basis of the estimation value of the deterioration state and the estimation value of the SOC acquired from the battery state estimator 23 (S401).

Incidentally, in the case where the thermal stability data storage 241 is realized by a database or the like, the deterioration state and the SOC may be recorded as attributions in association with the thermal stability data. In such a case, by using a management function such as RDBMS, the thermal stability data can be extracted. Incidentally, the thermal stability data may be extracted when each of the estimation values of the deterioration state and the SOC is within a predetermined allowable range although such a value does not completely coincide with the value associated with the thermal stability data.

The calorific value estimator 243 estimates the calorific values and the like for the positive electrode and the negative electrode on the basis of the thermal stability data acquired by the thermal stability data acquirer 242 (S402). The safety index calculator 244 estimates the end-point cell temperature and calculates the safety index regarding the end-point cell temperature on the basis of the calorific values, the specific heat, the heat transfer coefficient and the external temperature (S403). The safety evaluator 245 determines the safety evaluation on the basis of the safety index (S404). The above is a flowchart of the battery safety evaluation process.

The output device 25 outputs the calculated safety index, safety evaluation and the like. Moreover, it may output the process results of the other components. For example, when it is determined that thermal runaway of the storage battery 1 will happen, the output device 25 may receive the external temperature in the occasion when thermal runaway of the storage battery 1 happens, that is, the thermal runaway temperature from the calorific value estimator 243, and output it.

An output method of the output device 25 is not specially limited but it may give a file, a mail, an image, sound, light and the like. For example, the battery safety evaluation apparatus 2 being connected to a display, a speaker and the like through the output device 25, the results of the processes of the components may be output to another device. For example, when the safety evaluation is "danger", an image or light warning a user may be displayed on the display in order to cause the user to recognize the danger, or warning sound may be output from the speaker. Incidentally, information output by the output device 25 is not specially limited. For example, information used for the battery safety evaluation, such as the inner state parameter, the battery characteristic and the thermal stability data, may be output.

As described above, according to the first embodiment, safety of the storage battery 1 is evaluated on the basis of not only the present deterioration state of the storage battery 1 but also the present SOC thereof. Therefore, the evaluation more correctly indicates the present safety of the storage battery 1, which enables restriction applied to the storage battery 1 to be subdivided in accordance with the safety.

Thereby, batteries can be individually handled on the basis of indexes for these, which can bring out the effects of both safety and convenience.

Moreover, by using the charge/discharge curve analysis, it is unnecessary to detach the storage battery 1 from the device and to attach it to a measurement device. This can cause the safety evaluation to result in less labor, which enables devices each of which includes the storage battery 1 to be practically individually examined.

Second Embodiment

According to the first embodiment, when the evaluation by the battery safety evaluation apparatus 2 is lower than a designated safety standard, restriction on the storage battery 1 carried in or the similar restriction is supposed. Nevertheless, such restriction is to impair user's convenience. Therefore, the battery safety evaluation apparatus 2 of the present embodiment performs a battery safety adjustment process. The battery safety adjustment process is a process of decreasing the value of the SOC to satisfy the safety standard. Specifically, it is a process of causing the storage battery 1 to discharge to decrease the value of the SOC.

Figure 10A:
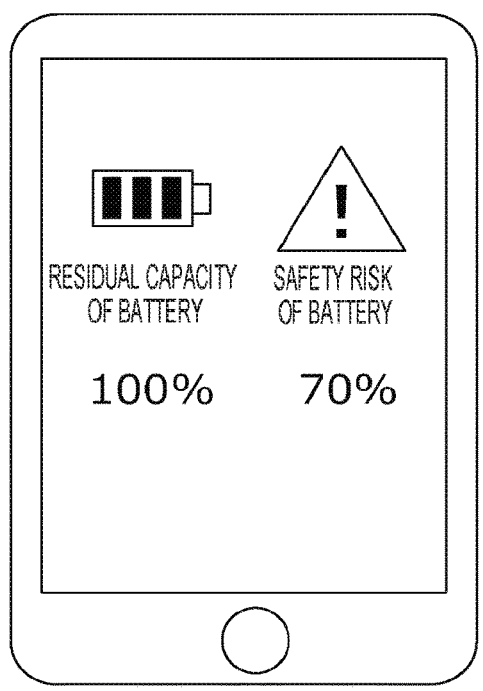
FIGS. 10A and 10B are diagrams for explaining safety of a storage battery before and after performing a battery safety adjustment process.
Figure 10B:
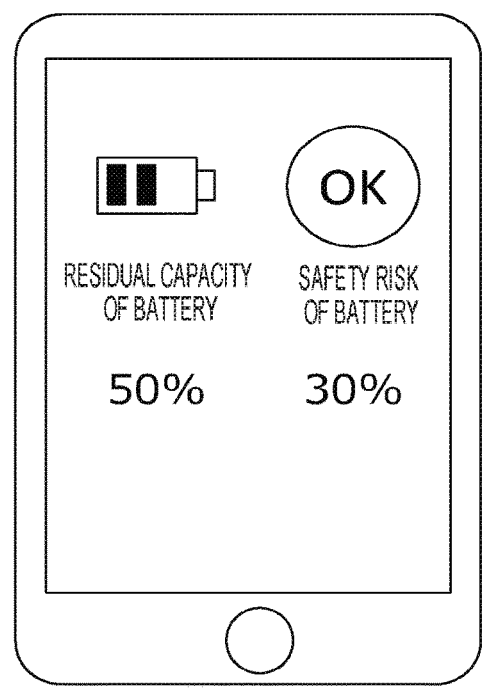

FIGS. 10A and 10B are diagrams for explaining safety of a storage battery before and after performing the battery safety adjustment process. FIG. 10A is a diagram before performing the battery safety adjustment process. FIG. 10B is a diagram after performing the battery safety adjustment process. Before performing the battery safety adjustment process, the residual capacity of the battery is 100%, that is, the SOC is 100%. Moreover, a "battery safety risk" as the safety index is displayed to be 70%. It is herein supposed that a lower "battery safety risk" means higher safety. It is assumed that the storage battery 1 cannot enter a place with 30% of safety standard if the storage battery 1 is in such a state. In such the assumption, the user inputs a target value of safety evaluation into the battery safety evaluation apparatus 2. Then, the battery safety adjustment process is performed. As the result, the residual capacity of the battery decreases as illustrated in FIG. 10B, but the storage battery 1 comes into the status where the safety index satisfies the safety standard. The battery safety adjustment process is very advantageous to a user who wants to use the battery even with a decreased residual capacity thereof.

Figure 11:
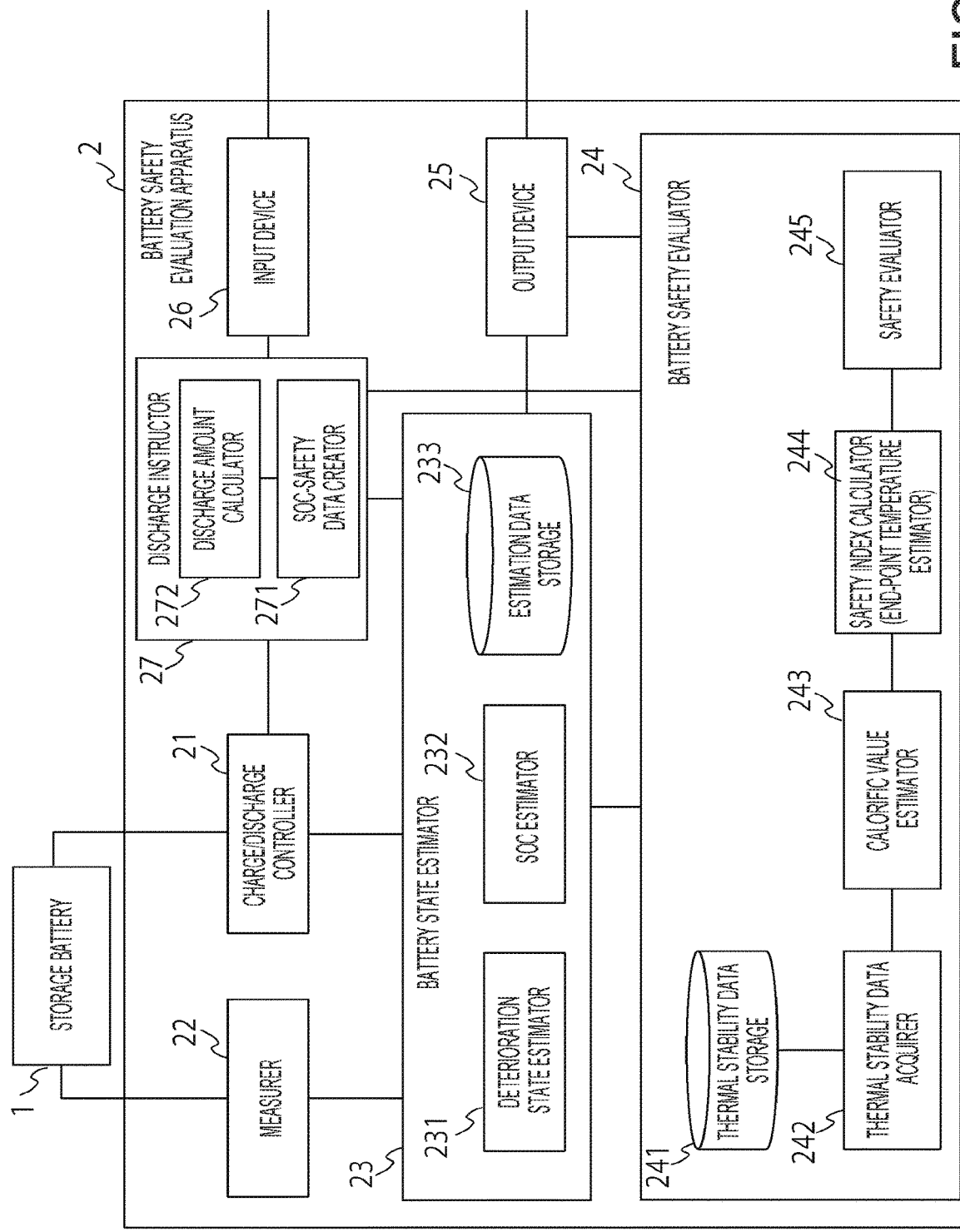
FIG. 11 is a block diagram illustrating an example of a schematic configuration of a power storage system according to a second embodiment.

FIG. 11 is a block diagram illustrating an example of a schematic configuration of a power storage system according to a second embodiment. The second embodiment is different from the first embodiment in that the battery safety evaluation apparatus 2 further includes an input device 26 and a discharge instructor 27. Description of the same matters to those of the first embodiment is omitted.

The input device 26 receives an input with respect to the safety evaluation from a user. For example, it may receive an instruction to perform the battery safety adjustment process due to the safety evaluation not satisfying the safety standard. Moreover, it may receive a target value with respect to the safety evaluation, an evaluation class (target class) as a target, or the like. As an input method, a known technique can be used, not specially limited. For example, the input device 26 may receive the input from the user using a GUI.

The discharge instructor 27 instructs the charge/discharge controller 21 to discharge in order to adjust the safety evaluation on the basis of the input with respect to the safety evaluation. The charge/discharge controller 21 discharges on the basis of the instruction, and thereby, the value of the SOC after the discharge decreases. The decrease of the value of the SOC improves safety. That is, the safety evaluation moves toward one which is safer than before.

The discharge based on the instruction of the discharge instructor 27 may be performed by various methods. For example, the discharge instructor 27 may perform instruction to discharge by a predetermined discharge amount. In the case, the safety evaluation is output for the user after the discharge to make sure whether further discharge is necessary.

Alternatively, as another method, the discharge instructor 27 performing instruction to discharge by the predetermined discharge amount, the discharge instructor 27 may repeat the instruction until the difference between the safety evaluation after discharge and the target value becomes smaller than a threshold, or until the safety evaluation after discharge becomes the received target class. As above, the safety evaluation can be gradually brought to be closer to the target value.

Alternatively, the discharge instructor 27 may calculate a discharge amount for achieving the target value or the target class, and perform instruction to discharge by the discharge amount. The discharge instructor 27 illustrated in FIG. 11 adjusts the safety evaluation by this method. The discharge instructor 27 in the case of using this method includes an SOC-safety data creator 271 and a discharge amount calculator 272.

The SOC-safety data creator 271 creates data indicating relationship between the estimation value of the present SOC and the safety evaluation or the safety index. The data is expressed as SOC-safety data. The SOC-safety data creator 271 records the estimation value of the present SOC by the battery state estimator 23 in association with the safety index or the safety evaluation corresponding to that estimation value of the present SOC. The SOC-safety data is created by accumulating the record. Incidentally, the SOC-safety data is not needed to be originally created. For example, using SOC-safety data for a typical secondary battery as standard data, the standard data is updated by the recording. Thus, the SOC-safety data that corresponds to the storage battery 1 may be created.

Note that the safety index tends to suffer the influence of variation in environment since the safety index is calculated with environments other than that for the storage battery 1 taken into consideration. Therefore, SOC-safety data with drastic change is possibly created.

Figure 12A:
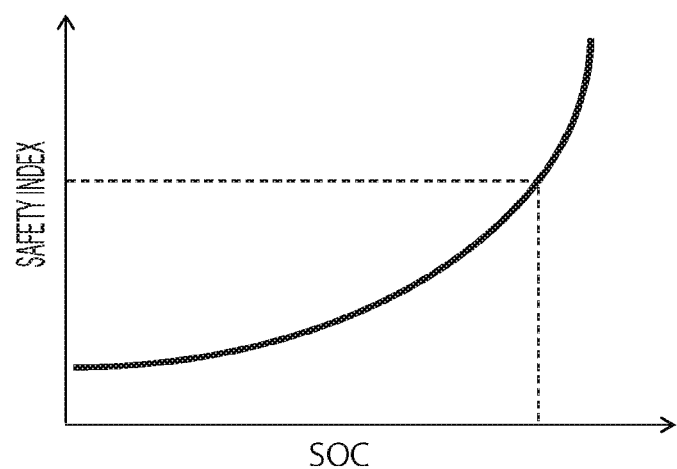
FIGS. 12A and 12B illustrate changes in SOC-safety data.
Figure 12B:
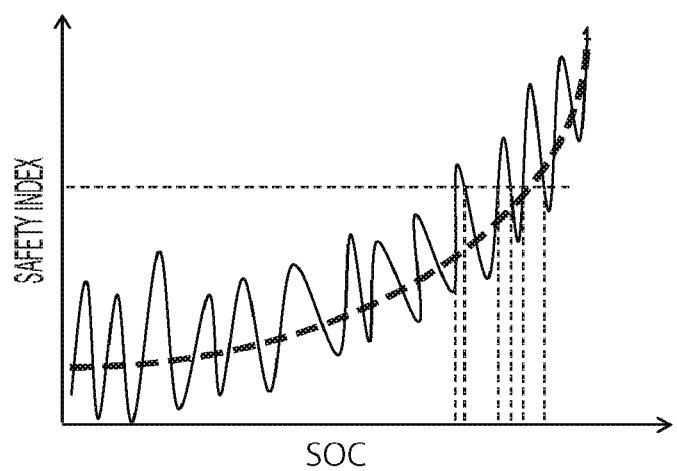

FIGS. 12A and 12B illustrate changes in SOC-safety data. FIG. 12A illustrates an ideal curve. FIG. 12B illustrates an actual curve. With the ideal curve, one SOC corresponds to one safety index. Meanwhile, with the actual curve, a plurality of SOCs correspond to one safety index.

Therefore, the SOC-safety data creator 271 may smooth the SOC-safety data such that one SOC corresponds to one safety index. For the smoothing, a known smoothing technique such as a moving average and a smoothing spline may be used.

Incidentally, another method of handling, not smoothing, may be used. When a plurality of values of the SOC correspond to one safety index, they may be collected into one by a predetermined selection rule such as a maximum, a minimum and a median.

The discharge amount calculator 272 examines the value of the SOC corresponding to the target value or the target class of the safety evaluation using the SOC-safety data. That is, it examines a target value of the SOC. Then, the discharge amount calculator 272 determines the discharge amount on the basis of the target value of the SOC. The lower limit of the discharge amount is calculated by multiplying the difference between the value of the present SOC and the target value of the SOC by the present battery capacity. Incidentally, the discharge amount is not necessarily made the same as the lower limit of the discharge amount. For example, in order to secure more safety, discharge may be performed more than the lower limit of the discharge amount.

The charge/discharge controller 21 controls the storage battery 1 to discharge by the designated discharge amount. Upon the end of the discharge, it sends an instruction to evaluate safety again to the battery state estimator 23 and the battery safety evaluator 24. The other components may perform the similar processes as in the aforementioned embodiment.

Incidentally, the safety evaluator 245 may use the input target value as the safety standard. When the input target value is used as the safety standard, evaluation from the output device 25 indicates whether the input target value has been satisfied. In this case, the user can intuitively understand that the storage battery 1 (product using the storage battery 1) satisfies the safety standard.

Figure 13:
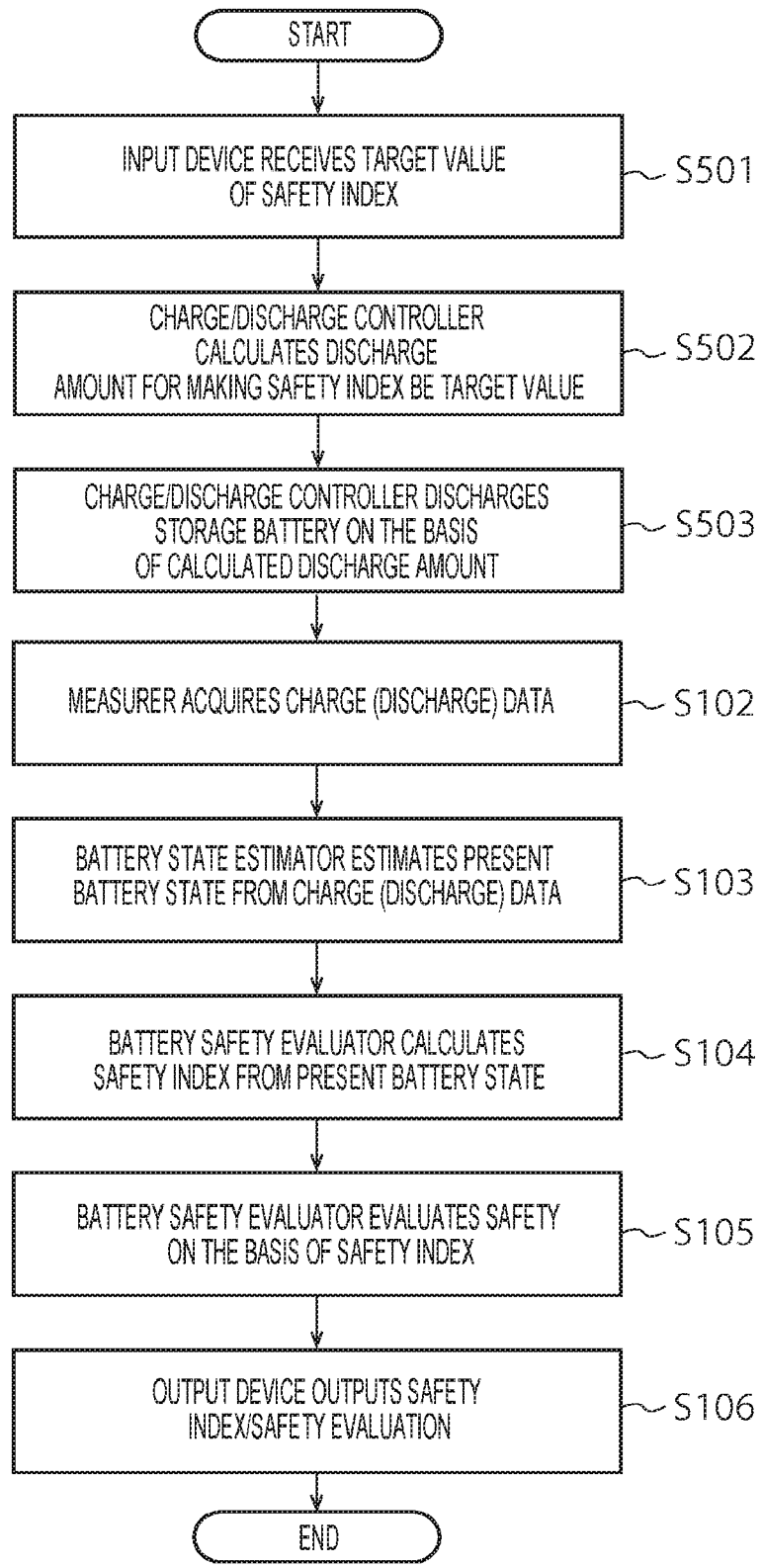
FIG. 13 illustrates an example of a flowchart of the battery safety adjustment process.

FIG. 13 illustrates an example of a flowchart of the battery safety adjustment process. In this flowchart, it is supposed to determine a discharge amount in accordance with the target value, not to repeatedly discharge by a predetermined discharge amount. First, the input device 26 receives the target value of the safety evaluation from the outside (S501). The discharge amount calculator 272 calculates the discharge amount for making the safety evaluation be the target value (S502). The charge/discharge controller 21 controls the storage battery 1 to discharge the calculated discharge amount (S503). The processes thereafter are the same as those in the first embodiment and omitted. As above, safety in the newest state after discharge is evaluated, and a numerical value that satisfies the designated safety standard is output.

As described above, according to the second embodiment, even when the storage battery 1 does not satisfy the safety standard, the storage battery 1 can be adjusted so as to satisfy the safety standard. This brings out the effects of both safety and convenience.

Third Embodiment

In the embodiments above, the thermal stability data acquirer 242 acquires the thermal stability data corresponding to the storage battery 1 from the thermal stability data stored in the thermal stability data storage 241. However, since there are wide varieties of states of the storage battery 1, the capacity of the thermal stability data storage 241 needs to be bloated if the thermal stability data storage 241 try to store all the thermal stability data. Moreover, thermal stability data corresponding to the storage battery 1 is possibly not in the thermal stability data storage 241. Therefore, in a third embodiment, the thermal stability data is externally acquired and updated. Thereby, the quantity of thermal stability data stored in the thermal stability data storage 241 can be reduced, which enables the battery safety evaluator 24 to be downsized and costs regarding production of the battery safety evaluator 24 to be reduced. Moreover, the number of types of supported storage batteries 1 can be increased.

Figure 14:
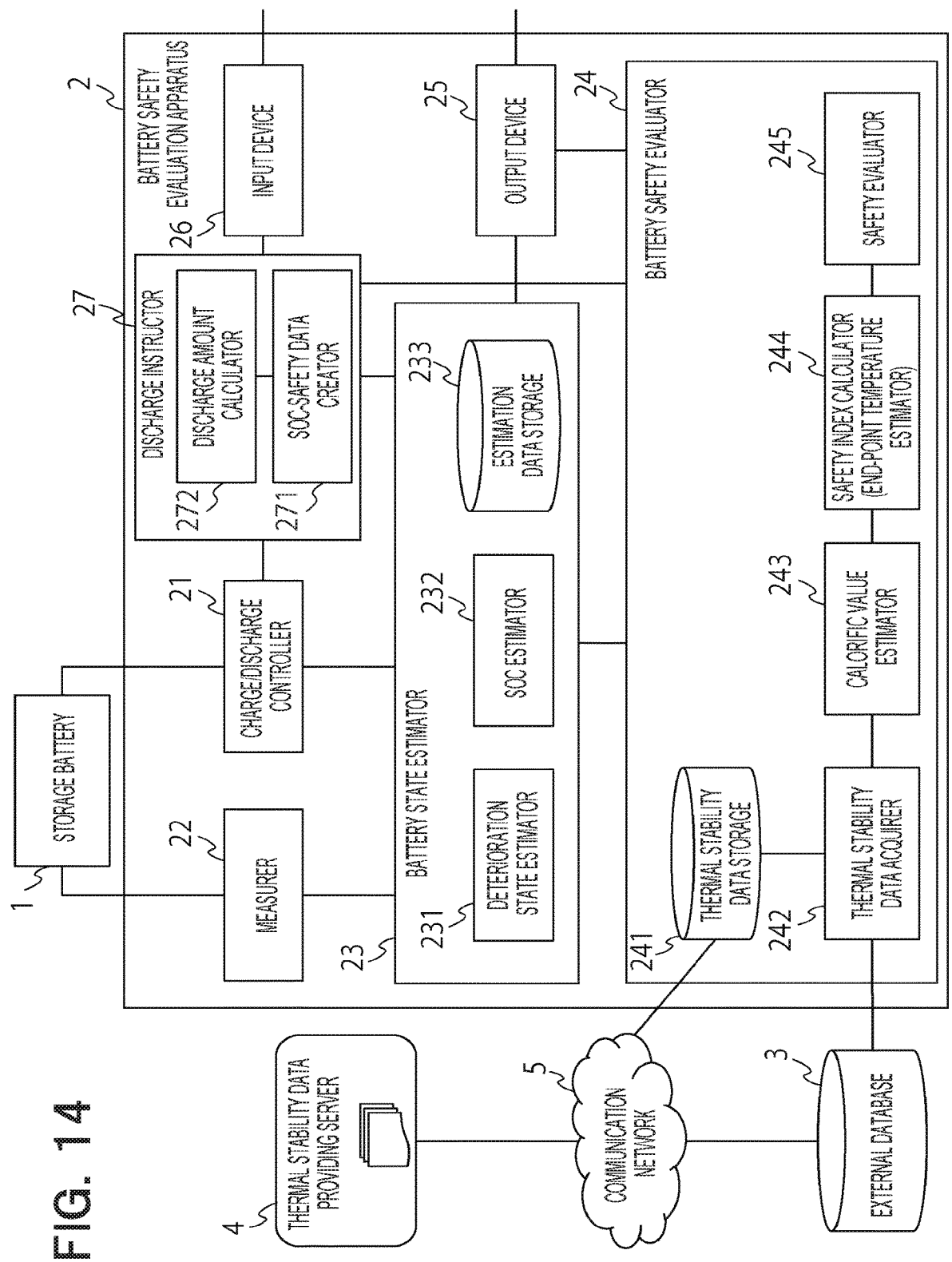
FIG. 14 is a block diagram illustrating an example of a schematic configuration of a power storage system according to a third embodiment.

FIG. 14 is a block diagram illustrating an example of a schematic configuration of a power storage system according to the third embodiment. The third embodiment is different from the aforementioned embodiments in that the thermal stability data acquirer 242 is connected to the outside. Description of the same matters to those of the aforementioned embodiments is omitted.

The thermal stability data acquirer 242 is connected to a device or the like that provides thermal stability data via wired or wireless communication, or via an electric signal, which enables communication of data therebetween. The device or the like that provides thermal stability data is not specially limited but may be an external database 3 storing thermal stability data or may be a thermal stability data providing server 4 that generates and provided thermal stability data. Hereafter, the device or the like that provides thermal stability data is referred to as "thermal stability data providing device". The thermal stability data acquirer 242 may be connected to the thermal stability data providing device via a communication network 5. Alternatively, it may be connected directly or indirectly to the external database 3 via a device interface.

Acquisition of thermal stability data by the thermal stability data acquirer 242 is assumed to be performed when thermal stability data corresponding to the storage battery 1 is lacked. However, such a timing is not limited to a particular timing. For example, acquisition may be performed when the thermal stability data providing device generates new thermal stability data, or may be performed regularly. When necessary thermal stability data is not found in the thermal stability data storage 241, thermal stability data corresponding to the standard, battery characteristic, deterioration state, or the like of the storage battery 1 is acquired on the basis thereof. Incidentally, thermal stability data may be acquired from the thermal stability data providing device without specifying a condition and the like. Moreover, thermal stability data which has been acquired but is considered not to be necessary is sufficient not to be stored in the thermal stability data storage 241.

Incidentally, the thermal stability data storage 241 may delete thermal stability data stored therein. For example, for capacity saving, it is not necessary for the thermal stability data storage 241 to store therein thermal stability data satisfying a predetermined deletion condition, such as expired thermal stability data and thermal stability data which is seldom used.

Figure 15:
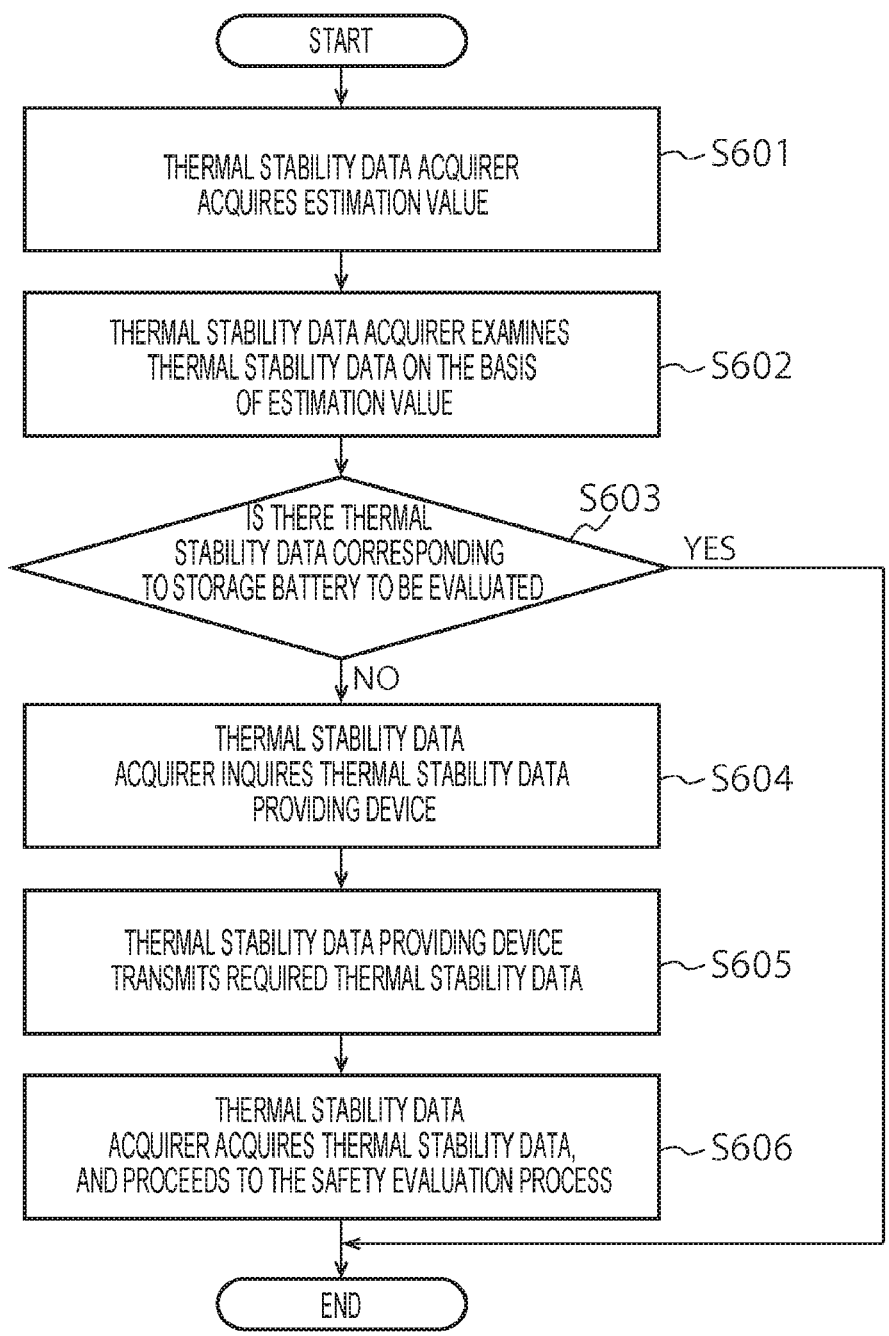
FIG. 15 illustrates an example of a flowchart of a thermal stability data acquisition process.

FIG. 15 is a diagram exemplarily illustrating a flowchart of a thermal stability data acquisition processing. This flowchart illustrates a flow in the case where the thermal stability data is acquired before the battery safety evaluation process.

The thermal stability data acquirer 242 acquires the estimation values of the deterioration state and the SOC of the storage battery 1 from the battery state estimator 23 (S601). The thermal stability data acquirer 242 determines whether the thermal stability data storage 241 stores therein thermal stability data corresponding to the storage battery 1, on the basis of the acquired estimation values (S602).

When the thermal stability data storage 241 stores thermal stability data corresponding to the storage battery 1 (YES in S603), the flow is ended. When the thermal stability data storage 241 does not store thermal stability data corresponding to the storage battery 1 (NO in S603), the thermal stability data acquirer 242 sends an inquiry to the thermal stability data providing device (S604). The inquiry is assumed to include the acquired estimation values.

The thermal stability data providing device transmits thermal stability data which is regarded as corresponding to the storage battery 1 on the basis of the received estimation values of the battery characteristics or the like (S605). Then, the thermal stability data acquirer 242 acquires the transmitted thermal stability data, and proceeds to the battery safety evaluation process (S606). The battery safety evaluation process is as above. The flow of the thermal stability data acquisition process has been described.

As described above, according to the third embodiment, even if thermal stability data required for the battery safety evaluation process is not stored in the thermal stability data storage 241, the required thermal stability data can be acquired on the basis of the battery characteristics or the like of the storage battery 1. Thereby, the quantity of thermal stability data stored in the thermal stability data storage 241 can be reduced, which enables the battery safety evaluator 24 to be downsized and costs regarding production of the battery safety evaluator 24 to be reduced. Moreover, the number of types of supported storage batteries 1 can be increased.

Each process in the embodiments described above can be implemented by a dedicated circuit or implemented using software (program). When using the software (program), the embodiments described above can be implemented, for example, using a general-purpose computer apparatus as basic hardware and causing a processor, such as a CPU (central processing unit), mounted in the computer apparatus to execute the program.

Figure 16:
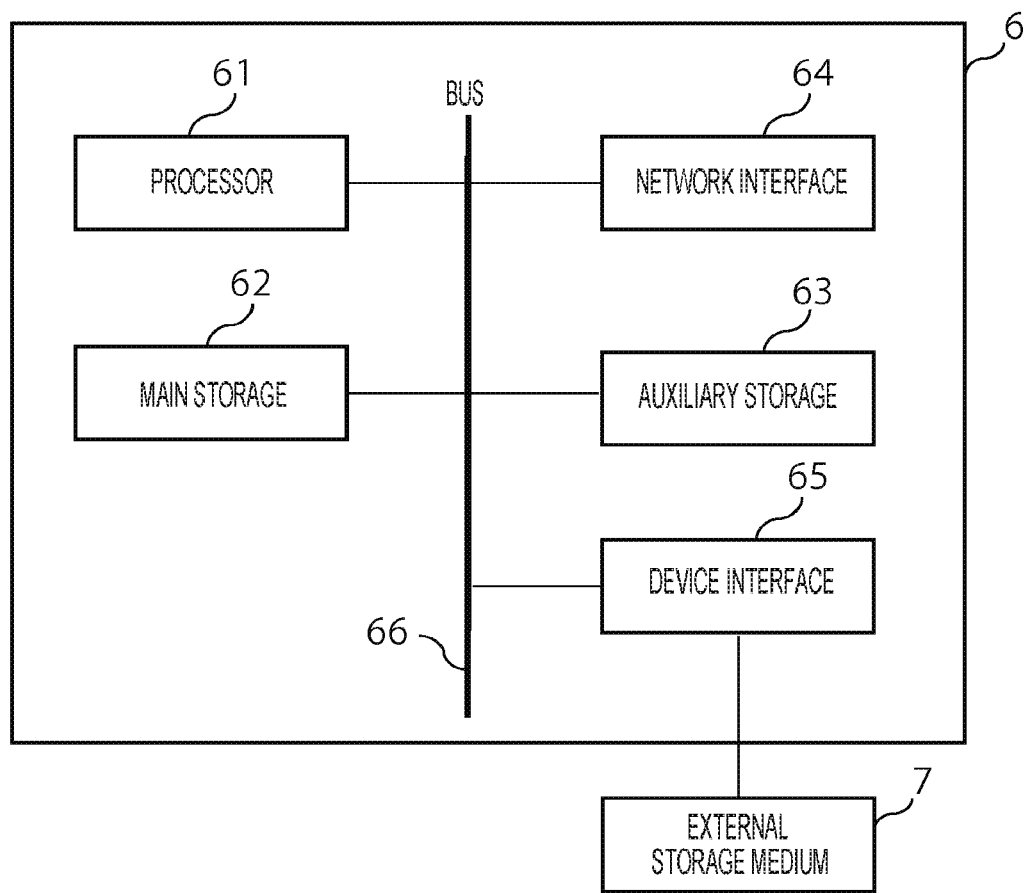
FIG. 16 is a block diagram illustrating an example of a hardware configuration of an embodiment of the present invention.

FIG. 16 is a block diagram illustrating an example of a hardware configuration according to an embodiment of the present invention. The battery safety evaluation apparatus 2 can be realized by a computer device 6 including a processor 61, a main storage 62, an auxiliary storage 63, a network interface 64, and a device interface 65, which are connected to one another via a bus 66.

The processor 61 reads out a program from the auxiliary storage 63, develops the program onto the main storage 62, and executes the program. As a result of this, functions of the components of the battery safety evaluation apparatus 2 can be achieved.

The processor 61 is an electronic circuit including a controller and a calculator of a computer. As the processor 61, a general-purpose processor, a central processor (CPU), a microprocessor, a digital signal processor (DSP), a controller, a microcontroller, a state machine, an application specific integrated circuit, a field programmable gate array (FPGA), a programmable logic circuit (PLD), or the combination thereof can be used, for example.

The battery safety evaluation apparatus 2 of the present embodiment may be realized by installing a program to be executed by the components into the computer device 6 in advance, or installing the program, which is stored in a storage medium such as a CD-ROM is distributed via a network, into the computer device 6 as proper timing.

The main storage 62 is a memory that temporarily stores an instruction to be executed by the processor 61, various types of data, and the like, and may be a volatile memory such as a DRAM, or may be a non-volatile memory such as an MRAM. The auxiliary storage 63 is a storage that permanently stores a program, data, and the like. For example, the auxiliary storage 63 is a flash memory, for example.

The network interface 64 is an interface for wired or wireless connection to a communication network. In the case where the thermal stability data acquirer 242 communicates with the thermal stability data providing device, the communication processing function of the thermal stability data acquirer 242 can be realized by the network interface 64. In the drawing, only one network interface 64 is illustrated, but a plurality of the network interfaces 64 may be mounted.

The device interface 65 is an interface such as a USB for connection to an external storage medium 7 that stores therein an output result and the like. In the case where the thermal stability data providing device is the external storage medium 7, a function for data exchange between the thermal stability data acquirer 242 and the external storage medium 7 can be realized by the device interface 65. The external storage medium 7 may be any storage medium such as an HDD, a CD-R, a CD-RW, a DVD-RAM, a DVD-R, a SAN (storage area network), or the like. The external storage medium 7 may be connected to the storage battery 1 via the device interface 65.

The computer device 6 may be configured by dedicated hardware such as a semiconductor integrated circuit having the processor 61 mounted thereon. The dedicated hardware may be configured by combination with a storage such as an RAM or an ROM. The computer device 6 may be incorporated inside the storage battery 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A battery safety evaluation apparatus comprising:
a battery state estimator configured to estimate an estimation value of a present deterioration state of a first battery and an estimation value of a present SOC (State of Charge) of the first battery on the basis of data of voltage and current of the first battery measured in charging or discharging the first battery; a calorific value estimator configured to estimate, on the basis of first reference data, a calorific value of the first battery in an occasion when an external temperature changes; and
a safety index calculator configured to calculate, on the basis of the calorific value of the first battery, a safety index regarding a temperature of the first battery in the occasion when the external temperature changes, wherein
the first reference data is selected as corresponding to the first battery from a plurality of reference data at least indicating relationship between a calorific value of a secondary battery and an external temperature, on the basis of the estimation value of the present deterioration state of the first battery and the estimation value of the present SOC of the first battery.

2. The battery safety evaluation apparatus according to claim 1, wherein
the safety index calculator calculates a temperature of the first battery at the external temperature on the basis of the calorific value of the first battery estimated by the calorific value estimator, a specific heat of the first battery, a heat transfer coefficient between the first battery and an outside of the first battery, and the external temperature, and
the safety index calculator calculates the safety index on the basis of the calculated temperature of the first battery.

3. The battery safety evaluation apparatus according to claim 1, further comprising:
a charge/discharge controller configured to control charge or discharge of the first battery; and
a measurer configured to measure the voltage and the current of the first battery, wherein
the battery state estimator estimates the estimation value of the present deterioration state of the first battery and the estimation value of the present SOC of the first battery on the basis of the data of the voltage and the current obtained by measurement of the measurer, and
the present is defined as a most recent time point when the measurer has measured the voltage and the current of the first battery.

4. The battery safety evaluation apparatus according to claim 1, further comprising:
a safety evaluator configured to perform evaluation on present safety of the first battery or an assembled battery including the first battery on the basis of the safety index; and
an output device configured to output the evaluation.

5. The battery safety evaluation apparatus according to claim 4, wherein
the safety evaluator selects, as the evaluation, an evaluation class matching the first battery from a plurality of evaluation classes on the basis of the safety index and a threshold for the safety index.

6. The battery safety evaluation apparatus according to claim 3, further comprising:
a safety evaluator configured to perform evaluation on present safety of the first battery or an assembled battery including the first battery on the basis of the safety index;
an output device configured to output the evaluation;
an input device configured to receive an input with respect to the evaluation; and
a discharge instructor configured to instruct, on the basis of the input, the charge/discharge controller to perform discharge, wherein
by the charge/discharge controller performing the discharge in accordance with the instruction, evaluation after the input is more improved than evaluation before the input in terms of safety.

7. The battery safety evaluation apparatus according to claim 6, wherein
when the input is a target value or a target class, the discharge instructor calculates a discharge amount by which the evaluation becomes the target value or the target class using SOC-safety data,
the charge/discharge controller controls the first battery to discharge by the calculated discharge amount, and
the SOC-safety data indicates any one of (1) and (2):
(1) relationship between the estimation value of the present SOC of the first battery and the safety index; and
(2) relationship between the estimation value of the present SOC of the first battery and the evaluation.

8. The battery safety evaluation apparatus according to claim 7, further comprising
an SOC-safety data creator configured to create the SOC-safety data on the basis of (3) or (4):
(3) the estimation value of the present SOC of the first battery and the safety index corresponding to the estimation value of the present SOC of the first battery; or
(4) the estimation value of the present SOC of the first battery and the evaluation corresponding to the estimation value of the present SOC of the first battery, wherein
by the SOC-safety data creator smoothing the SOC-safety data, a value of an SOC corresponding to the target value or the target class is uniquely specified in the SOC-safety data.

9. The battery safety evaluation apparatus according to claim 4, wherein
the output device displays content of output as an image.

10. The battery safety evaluation apparatus according to claim 4, wherein
the output device outputs content of output as a file.

11. The battery safety evaluation apparatus according to claim 4, wherein
the output device outputs an image, light or sound indicating warning on the basis of the evaluation.

12. The battery safety evaluation apparatus according to claim 4, wherein
the calorific value estimator calculates, on the basis of the first reference data, an external temperature in the occasion when the first battery causes thermal runaway as a thermal runaway temperature, and
the output device outputs the thermal runaway temperature.

13. The battery safety evaluation apparatus according to claim 1, further comprising
a reference data acquirer configured to select and acquire the first reference data on the basis of the estimation value of the present deterioration state of the first battery and the estimation value of the present SOC of the first battery.

14. A battery safety evaluation method comprising: estimating an estimation value of a present deterioration state of a first battery and an estimation value of a present SOC (State of Charge) of the first battery on the basis of data of voltage and current of the first battery measured in charging or discharging the first battery; estimating, on the basis of first reference data, a calorific value of the first battery in an occasion when an external temperature changes; and
calculating, on the basis of the calorific value of the first battery, a safety index regarding a temperature of the first battery in the occasion when the external temperature changes, wherein
the first reference data is selected as corresponding to the first battery from a plurality of reference data at least indicating relationship between a calorific value of a secondary battery and an external temperature, on the basis of the estimation value of the present deterioration state of the first battery and the estimation value of the present SOC of the first battery.

15. A non-transitory storage medium storing a computer program comprising:
estimating an estimation value of a present deterioration state of a first battery and an estimation value of a present SOC (State of Charge) of the first battery on the basis of data of voltage and current of the first battery measured in charging or discharging the first battery;
estimating, on the basis of first reference data, a calorific value of the first battery in an occasion when an external temperature changes; and
calculating, on the basis of the calorific value of the first battery, a safety index regarding a temperature of the first battery in the occasion when the external temperature changes, wherein the first reference data is selected as corresponding to the first battery from a plurality of reference data at least indicating relationship between a calorific value of a secondary battery and an external temperature, on the basis of the estimation value of the present deterioration state of the first battery and the estimation value of the present SOC of the first battery.

16. A control circuit comprising:
a battery state estimator configured to estimate an estimation value of a present deterioration state of a first battery and an estimation value of a present SOC (State of Charge) of the first battery on the basis of data of voltage and current of the first battery measured in charging or discharging the first battery;
a calorific value estimator configured to estimate, on the basis of first reference data, a calorific value of the first battery in an occasion when an external temperature changes; and
a safety index calculator configured to calculate, on the basis of the calorific value of the first battery, a safety index regarding a temperature of the first battery in the occasion when the external temperature changes, wherein
the first reference data is selected as corresponding to the first battery from a plurality of reference data at least indicating relationship between a calorific value of a secondary battery and an external temperature, on the basis of the estimation value of the present deterioration state of the first battery and the estimation value of the present SOC of the first battery.

17. A power storage system comprising:
a first battery which is a secondary battery to be evaluated; and
a battery safety evaluation apparatus configured to evaluate safety of the first battery, wherein the battery safety evaluation apparatus includes: a battery state estimator configured to estimate an estimation value of a present deterioration state of a first battery and an estimation value of a present SOC (State of Charge) of the first battery on the basis of data of voltage and current of the first battery measured in charging or discharging the first battery;
a calorific value estimator configured to estimate, on the basis of first reference data, a calorific value of the first battery in an occasion when an external temperature changes; and
a safety index calculator configured to calculate, on the basis of the calorific value of the first battery, a safety index regarding a temperature of the first battery in the occasion when the external temperature changes, and
the first reference data is selected as corresponding to the first battery from a plurality of reference data at least indicating relationship between a calorific value of a secondary battery and an external temperature, on the basis of the estimation value of the present deterioration state of the first battery and the estimation value of the present SOC of the first battery.

* * * * *